US012721170B2

(12) United States Patent
Yu et al.

(10) Patent No.: US 12,721,170 B2
(45) Date of Patent: Aug. 25, 2026

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Chen-Chiang Yu, Taoyuan City (TW); Tsung-Fu Tsai, Changhua County (TW); Szu-Wei Lu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 596 days.

(21) Appl. No.: 17/855,746

(22) Filed: Jun. 30, 2022

(65) Prior Publication Data

US 2024/0006268 A1 Jan. 4, 2024

(51) Int. Cl.

| | |
|---|---|
| ***H10W 90/00*** | (2026.01) |
| ***H10W 40/00*** | (2026.01) |
| ***H10W 40/77*** | (2026.01) |
| ***H10W 74/00*** | (2026.01) |
| *H10W 74/15* | (2026.01) |
| *H10W 76/10* | (2026.01) |

(52) U.S. Cl.

CPC ......... *H10W 40/77* (2026.01); *H10W 40/037* (2026.01); *H10W 90/00* (2026.01); *H10W 74/00* (2026.01); *H10W 74/15* (2026.01); *H10W 76/10* (2026.01); *H10W 90/401* (2026.01); *H10W 90/701* (2026.01); *H10W 90/724* (2026.01); *H10W 90/734* (2026.01)

(58) Field of Classification Search

CPC ............... H01L 23/433; H01L 21/4882; H01L 25/0655; H01L 23/498; H01L 24/16; H01L 24/32; H01L 24/73; H01L 25/162; H01L 25/165; H01L 2224/16227; H01L 2224/32225; H01L 2224/73204; H01L 2924/1431; H01L 2924/1436; H01L 2924/1437; H01L 2924/1611; H01L 2924/16196; H01L 2924/16235; H01L 2924/182; H01L 2924/3511; H01L 2924/37001; H01L 23/49816; H01L 23/49833; H10W 40/77; H10W 40/037; H10W 90/00; H10W 74/00; H10W 76/10

See application file for complete search history.

(56) References Cited

U.S. PATENT DOCUMENTS

| | | | | |
|---|---|---|---|---|
| 7,204,298 B2 * | 4/2007 | Hodes | .................. | H01L 23/473 257/E23.098 |
| 8,993,380 B2 | 3/2015 | Hou et al. | | |
| 9,265,176 B2 * | 2/2016 | Arvelo | ................. | H01L 23/473 |

(Continued)

*Primary Examiner* — Dale E Page
*Assistant Examiner* — Cristian A Tivarus
(74) *Attorney, Agent, or Firm* — JCIPRNET

(57) ABSTRACT

A package structure includes a circuit substrate, a semiconductor device, a plurality of cooling pins, a cooler lid, an anti-fouling coating and a top lid. The semiconductor device is disposed on and electrically connected to the circuit substrate. The cooling pins are disposed on the semiconductor device. The cooler lid is attached to the cooling pins, wherein the cooler lid includes an inlet opening and an outlet opening exposing portions of the cooling pins. The anti-fouling coating is coated on the cooling pins and on an inner surface of the cooler lid. The top lid is attached to an outer surface of the cooler lid.

20 Claims, 20 Drawing Sheets

(56) References Cited

U.S. PATENT DOCUMENTS

| | | | | |
|---|---|---|---|---|
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,770,372 | B2 * | 9/2020 | Gutala | G06F 30/398 |
| 2009/0283902 | A1 * | 11/2009 | Bezama | H01L 23/473 257/713 |
| 2012/0227936 | A1 * | 9/2012 | Yang | F28D 15/0233 427/248.1 |
| 2015/0138723 | A1 * | 5/2015 | Shedd | F25B 41/00 165/104.29 |
| 2019/0385925 | A1 * | 12/2019 | Walczyk | H01L 23/473 |
| 2019/0385933 | A1 * | 12/2019 | Eid | H01L 23/467 |
| 2020/0176357 | A1 * | 6/2020 | Yu | H01L 23/10 |
| 2020/0357768 | A1 * | 11/2020 | Shih | H01L 23/49822 |
| 2020/0409398 | A1 * | 12/2020 | Gebrehiwot | H01L 23/473 |
| 2022/0130734 | A1 * | 4/2022 | Chiu | H01L 23/31 |

* cited by examiner

PACKAGE STRUCTURE AND METHOD OF FABRICATING THE SAME

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
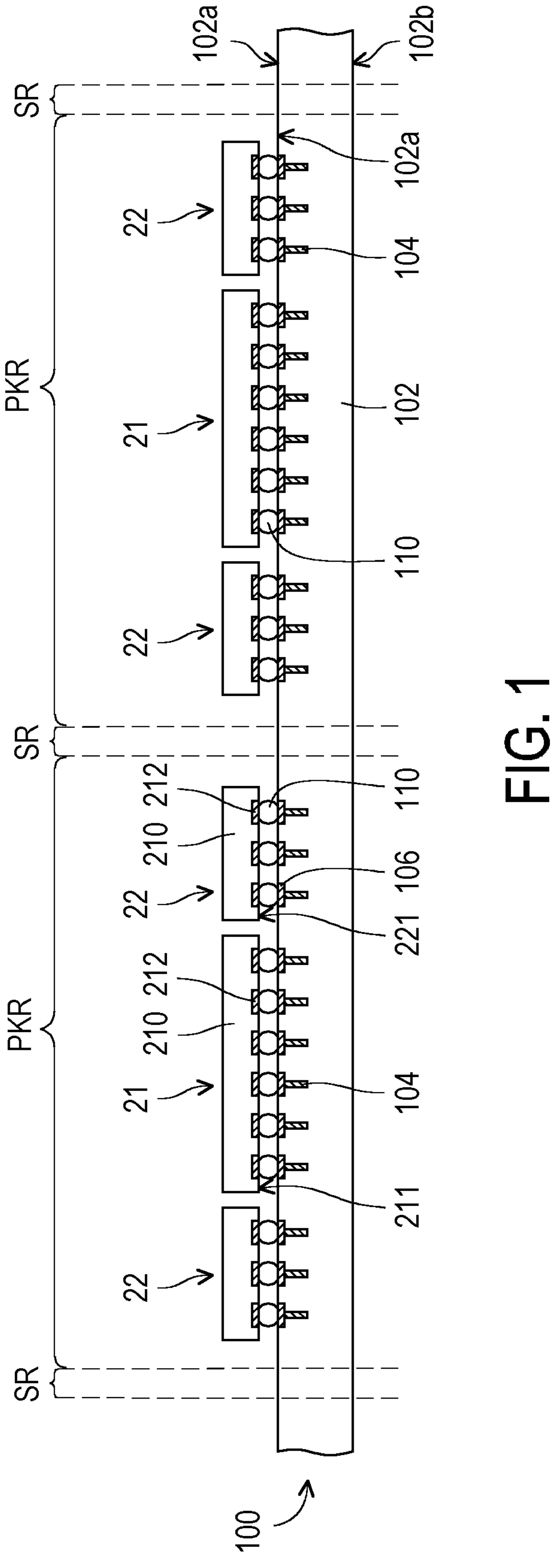
FIG. 1 to FIG. 11 are schematic sectional and top views of various stages in a method of fabricating a water-cooling component over a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on" "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices.

The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In conventional water-cooling type heat dissipation components used in semiconductor devices, cooling pins (or cooling fins) in the heat dissipation component are generally made of silicon, aluminum, polydimethylsiloxane, or other materials that are compatible with the coolant. However, due to the low thermal conductivity of the material used in the cooling pins, this may lead to insufficient cooling capacity for modern high power HPC (high performance computing) chips. In some embodiments of the present disclosure, a package structure includes a semiconductor device and a water-cooling component disposed on the semiconductor device. The water-cooling component includes a material having high thermal conductivity, and an anti-fouling coating coated on the material having high thermal conductivity. As such, oxidation/corrosion of the high thermal conductivity material may be prevented using the anti-fouling coating, while there is neglectable impact on thermal conductivity.

FIG. 1 to FIG. 11 are schematic sectional and top views of various stages in a method of fabricating a water-cooling component over a semiconductor device according to some exemplary embodiments of the present disclosure. As illustrated in FIG. 1, an interposer structure 100 is provided. In some embodiments, the interposer structure 100 includes a core portion 102, and a plurality of through vias 104 and conductive pads 106 formed therein. In some embodiments, the core portion 102 is a substrate such as a bulk semiconductor substrate, silicon on insulator (SOI) substrate or a multi-layered semiconductor material substrate. The semiconductor material of the substrate (core portion 102) may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the core portion 102 is doped or undoped.

In some embodiments, the conductive pads 106 are formed on a first surface 102*a* of the core portion 102. In some embodiments, through vias 104 are formed in the core portion 102 and connected with the conductive pads 106. In some embodiments, the through vias 104 extend into the core portion 102 with a specific depth. In some embodiments, the through vias 104 are through-substrate vias. In some embodiments, the through vias 104 are through-silicon vias when the core portion 102 is a silicon substrate. In some embodiments, the through vias 104 may be formed by forming holes or recesses in the core portion 102 and then filling the recesses with a conductive material. In some embodiments, the recesses may be formed by, for example, etching, milling, laser drilling or the like. In some embodiments, the conductive material may be formed by an electrochemical plating process, chemical vapor deposition (CVD), atomic layer deposition (ALD) or physical vapor deposition (PVD), and the conductive material may include copper, tungsten, aluminum, silver, gold or a combination thereof. In some embodiments, the conductive pads 106 connected with the through vias 104 may be formed as conductive parts of the redistribution layer(s) formed on the interposer structure 100. In some embodiments, the conductive pads 106 include under bump metallurgies (UBMs). In certain embodiments, the interposer structure 100 may further include active or passive devices, such as transistors, capacitors, resistors, or diodes passive devices formed in the core portion 102.

As shown in FIG. 1, the core portion 102 has a plurality of package regions PKR and sub regions SR separating each of the plurality of package regions PKR. The through vias 104 and conductive pads 106 are formed in the core portion 102 within the package regions PKR. In some embodiments, the semiconductor dies 21 and semiconductor dies 22 are provided on the interposer structure 100, or on the core portion 102 within the package regions PKR. The semiconductor dies 21 and semiconductor dies 22 are individual dies singulated from a wafer. In some embodiments, the semiconductor dies 21 contain the same circuitry, such as devices and metallization patterns, or the semiconductor dies 21 are the same type of dies. In some embodiments, the semiconductor dies 22 contain the same circuitry, or the semiconductor dies 22 are the same type of dies. In certain embodiments, the semiconductor dies 21 and the semiconductor dies 22 have different circuitry or are different types of dies. In alternative embodiments, the semiconductor dies 21 and the semiconductor dies 22 may have the same circuitry.

In some embodiments, the semiconductor dies 21 may be major dies, while the semiconductor dies 22 are tributary dies. In some embodiments, the major dies are arranged on the core portion 102 in central locations of each package region PKR, while tributary dies are arranged side-by-side and spaced apart from the major dies. In some embodiments, the tributary dies are arranged aside the major dies, and around or surrounding the major dies. In one embodiment, four or six tributary dies are arranged around one major die per one package region PKR.

In certain embodiments, the semiconductor dies 21 has a surface area larger than that of the semiconductor dies 22. Also, in some embodiments, the semiconductor dies 21 and the semiconductor dies 22 may be of different sizes, including different surface areas and/or different thicknesses. In some embodiments, the semiconductor dies 21 may be a logic die, including a central processing unit (CPU) die, graphics processing unit (GPU) die, system-on-a-chip (SoC) die, a microcontroller or the like. In some embodiments, the semiconductor dies 21 is a power management die, such as a power management integrated circuit (PMIC) die. In some embodiments, the semiconductor dies 22 may be a memory die, including dynamic random access memory (DRAM) die, static random access memory (SRAM) die or a high bandwidth memory (HBM) die. The disclosure is not limited thereto, and the number, sizes and types of the semiconductor die disposed on the core portion 102 may be appropriately adjusted based on product requirement.

As illustrated in FIG. 1, the semiconductor dies 21 include a body 210 and connecting pads 212 formed on an active surface 211 of the body 210. In certain embodiments, the connecting pads 212 may further include pillar structures for bonding the semiconductor dies 21 to other structures. In some embodiments, the semiconductor dies 22 include a body 220 and connecting pads 222 formed on an active surface 221 of the body 220. In other embodiments, the connecting pads 222 may further include pillar structures for bonding the dies 22 to other structures.

In some embodiments, the semiconductor dies 21 and the semiconductor dies 22 are attached to the first surface 102*a* of the core portion 102, for example, through flip-chip bonding by way of the electrical connectors 110. Through the reflow process, the electrical connectors 110 are formed between the connecting pads 212, 222 and conductive pads 106, electrically and physically connecting the semiconductor dies 21, 22 to the core portion 102 of the interposer structure 100. In some embodiments, the electrical connectors 110 are located in between the semiconductor dies 21, 22 and the interposer structure 100. In certain embodiments, semiconductor dies 21, 22 are electrically connected to the through vias 104 and the conductive pads 106 through the electrical connectors 110. In one embodiment, the electrical connectors 110 are micro-bumps, such as micro-bumps having copper metal pillars. In another embodiment, the electrical connectors 110 are solder bumps, lead-free solder bumps, or micro bumps, such as controlled collapse chip connection (C4) bumps or micro bumps containing copper pillars. In some embodiments, the bonding between the semiconductor dies 21, 22 and the core portion 102 may be solder bonding. In some embodiments, the bonding between the semiconductor dies 21, 22 and the core portion 102 may be direct metal-to-metal bonding, such as copper-to-copper bonding.

Figure 2:
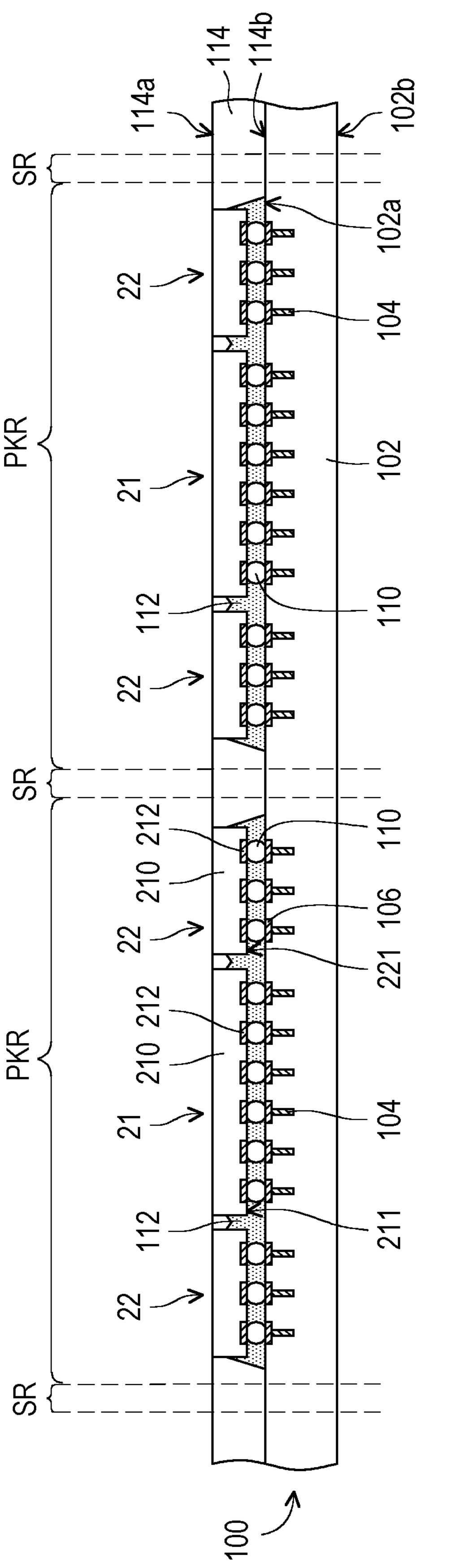

Referring to FIG. 2, in a subsequent step, an underfill structure 112 may be formed to cover the plurality of electrical connectors 110, and to fill up the spaces in between the semiconductor dies 21, 22 and the interposer structure 100. In some embodiments, the underfill structure 112 further cover side walls of the semiconductor dies 21, 22, and is located within the package region PKR. Thereafter, an insulating encapsulant 114 may be formed over the interposer structure 100 (or over the core portion 102) to cover the underfill structure 112, and to surround the semiconductor dies 21 and 22.

In some embodiments, the insulating encapsulant 114 is formed on the first surface 102*a* of the core portion 102 in the package regions PKR and over the sub regions SR. In some embodiments, the insulating encapsulant 114 is formed through, for example, a compression molding process or transfer molding. In one embodiment, a curing process is performed to cure the insulating encapsulant 114. In some embodiments, the semiconductor dies 21, 22 and the electrical connectors 110 are encapsulated by the insulating encapsulant 114. In some embodiments, a planarization process, including grinding or polishing, may be performed to partially remove the insulating encapsulant 114, exposing backside surfaces 21S, 22S of the semiconductor dies 21, 22. Accordingly, the backside surfaces 21S, 22S of the semiconductor dies 21, 22 are levelled with a top surface 114*a* of the insulating encapsulant 114. The top surface 114*a* being opposite to a backside surface 114*b* of the insulating encapsulant 114, wherein the backside surface 114*b* is in contact with the core portion 102.

In some embodiments, a material of the insulating encapsulant 114 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulant 114 may include an acceptable insulating encapsulation material. In some embodiments, the insulating encapsulant 114 may further include inorganic filler or inorganic compound (e.g. silica, clay, and so on) which can be added therein to optimize coefficient of thermal expansion (CTE) of the insulating encapsulant 114. The disclosure is not limited thereto.

Figure 3:
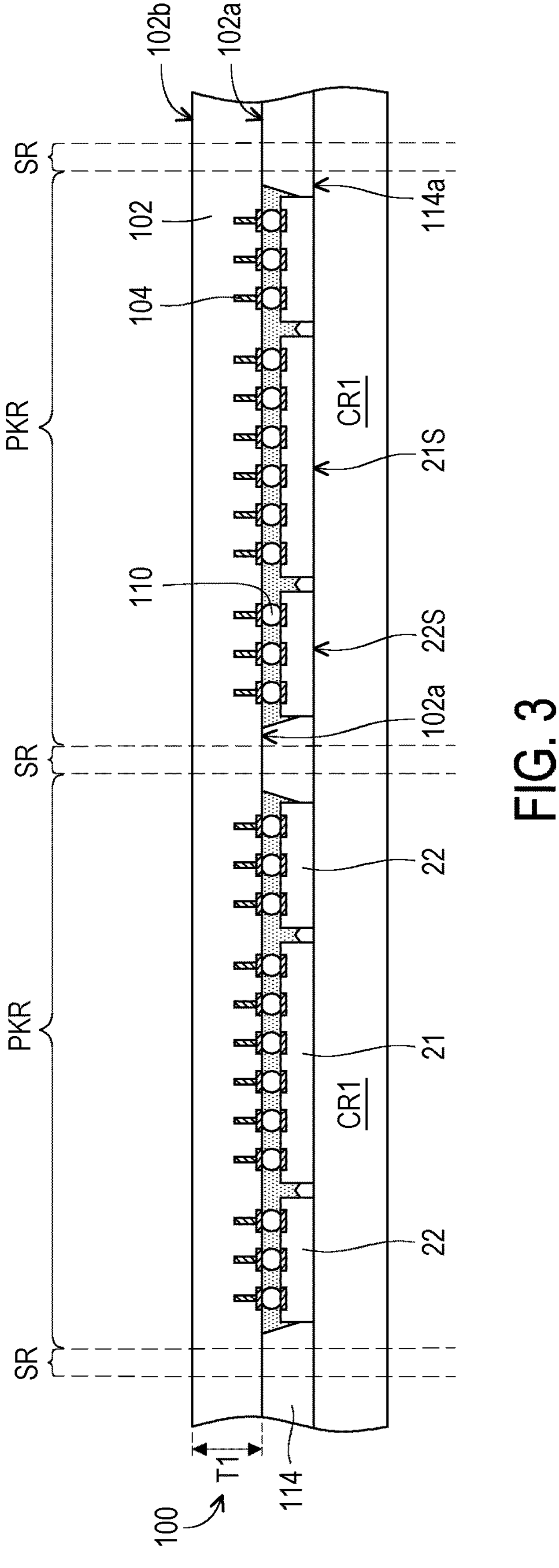

Referring to FIG. 3, the structure of FIG. 2 is turned upside down or flipped, and placed on a carrier CR1, so that the carrier CR1 directly contacts the backside surfaces 21S, 22S of the semiconductor dies 21, 22 and the top surface 114*a* of the insulating encapsulant 114. As shown in FIG. 3, at this stage of processing, the interposer structure 100 has not been thinned and has a thickness T1. In other words, the through vias 104 are not revealed, and are embedded in the core portion 102 of the interposer structure 100.

Figure 4:
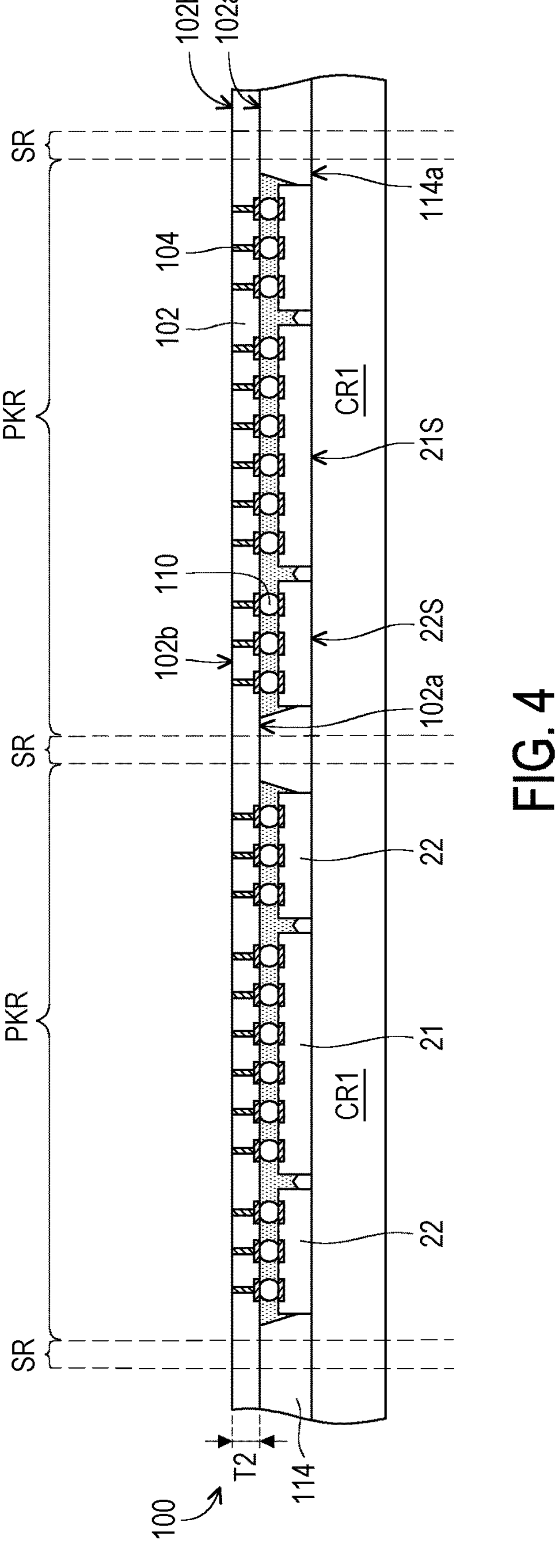

Referring to FIG. 4, a thinning process is performed to the interposer 100 to partially remove or thin the core portion 102 of the interposer structure 100 until the through vias 104 are exposed and a second surface 102*b* of the core portion 102 is formed. In some embodiments, the thinning process may include a back-grinding process, a polishing process or an etching process. In some embodiments, after the thinning process, the interposer structure 100 is thinned to a thickness T2. In some embodiments, a ratio of the thickness T2 to the thickness T1 ranges from about 0.1 to about 0.5.

Figure 5:
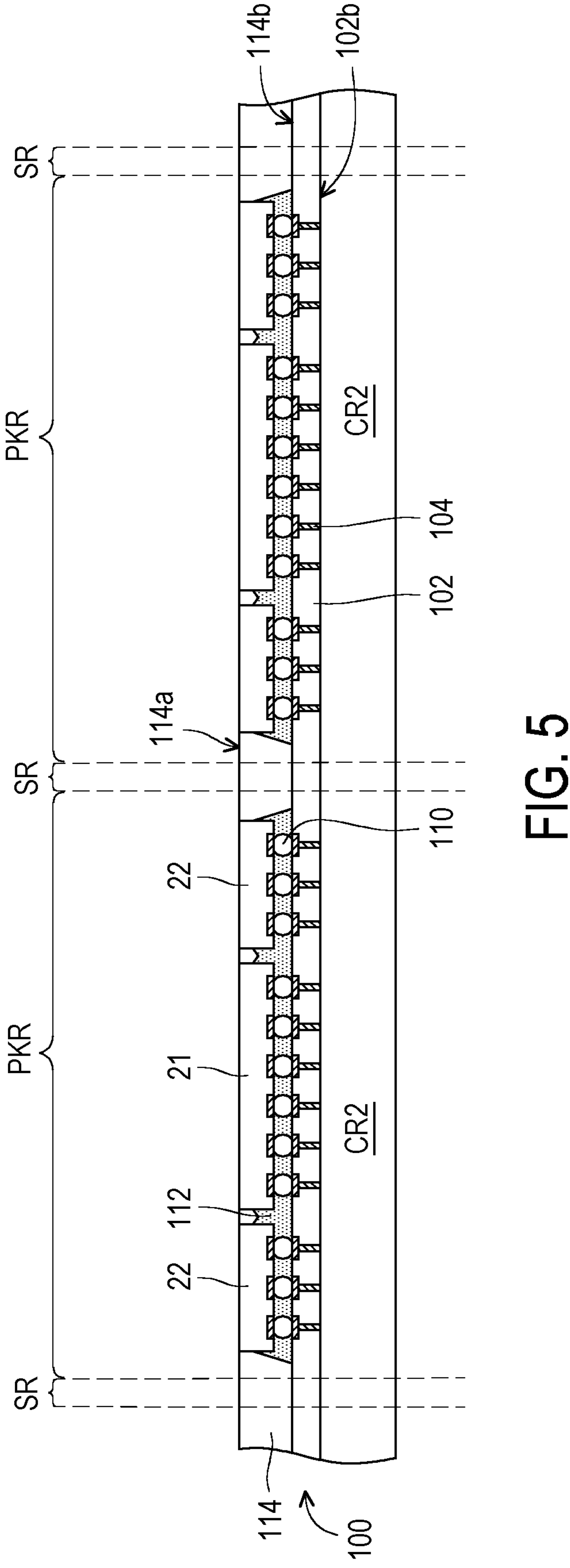

Referring to FIG. 5, in a subsequent step, the carrier CR1 is removed, and the structure shown in FIG. 4 is flipped upside down and transferred onto another carrier CR2. For example, in some embodiments, the second surface 102*b* of the core portion 102 is in contact with the carrier CR2. In some embodiments, the top surface 114*a* of the insulating encapsulant 114 and the backside surfaces 21S, 22S of the semiconductor dies 21, 22 are exposed.

Figure 6A:
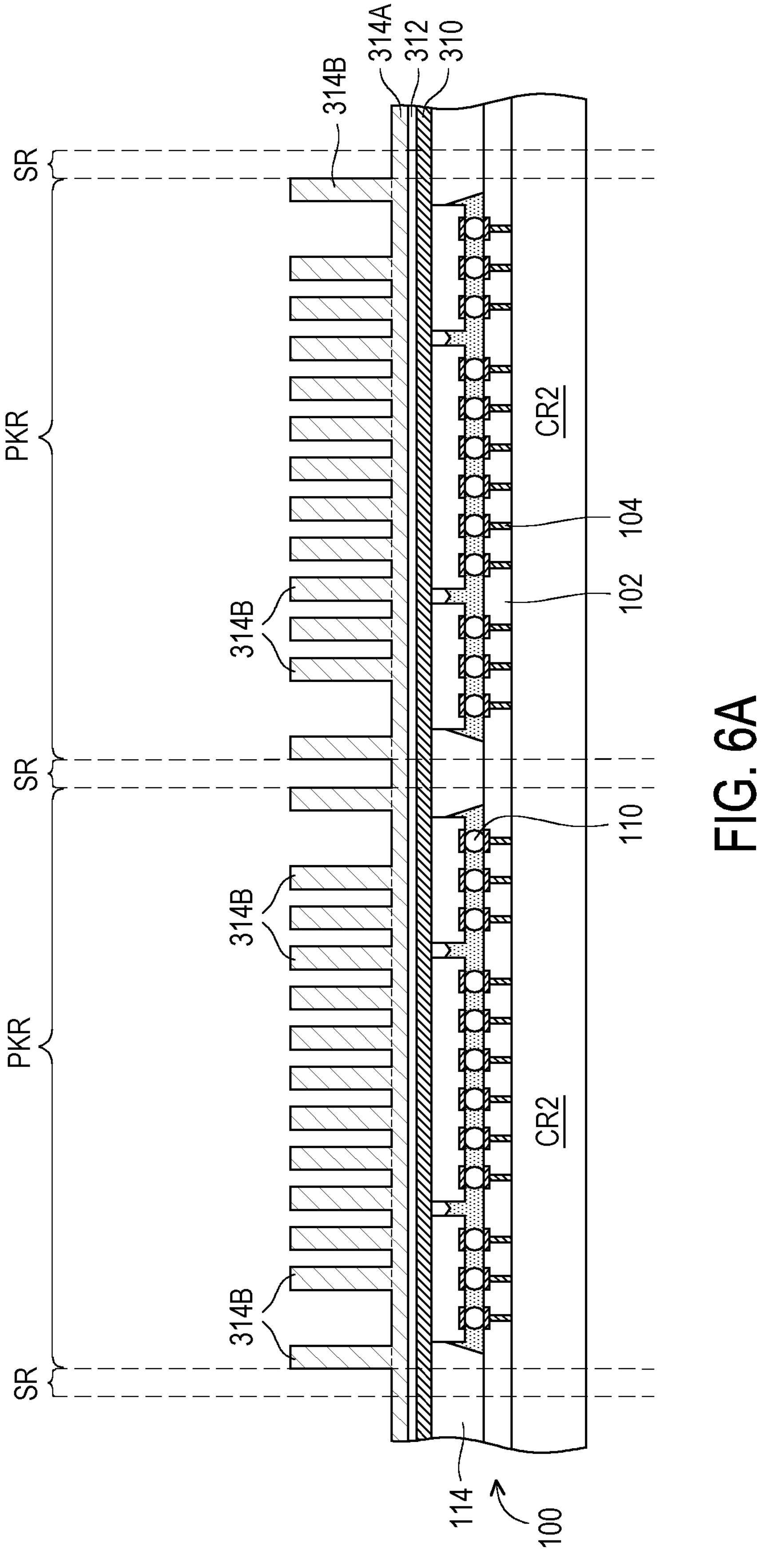

Referring to FIG. 6A, in a subsequent step, a backside metal layer 310 is formed over the top surface 114*a* of the insulating encapsulant 114. The backside metal layer 310 covers and contacts the backside surfaces 21S, 22S of the semiconductor dies 21, 22. In some embodiments, the backside metal layer 310 is for example made of metals such as aluminum, titanium, or the like. Furthermore, the backside metal layer 310 may be formed by CVD, PVD, or the like. In some embodiments, a seed layer 312 is formed on the backside metal layer 310. The seed layer 312 may be a titanium/copper composited layer, or the like. In certain embodiments, a cooling base 314A and a plurality of cooling pins 314B are formed on the seed layer 312. For example, the seed layer 312 is sandwiched between the cooling base 314A and the backside metal layer 310. Furthermore, the cooling pins 314B are disposed on the cooling base 314A within the package region PKR.

In the exemplary embodiment, the cooling base 314A and the cooling pins 314B are made of high thermal conductivity materials. For example, in one embodiment, the cooling base 314A and the cooling pins 314B are made of copper. In some embodiments, the cooling base 314A and the cooling pins 314B are formed over the seed layer 312 by electroplating or deposition. Although the cooling pins 314B are shown to be formed on or attached to the cooling base 314A, the disclosure is not limited thereto. In some alternative embodiments, the cooling base 314A may be omitted, and the cooling pins 314B may be directly formed on the seed layer 312. The details of the cooling pins 314B are further described with reference to the top views illustrated in FIG. 6B and FIG. 6C.

Figure 6B:
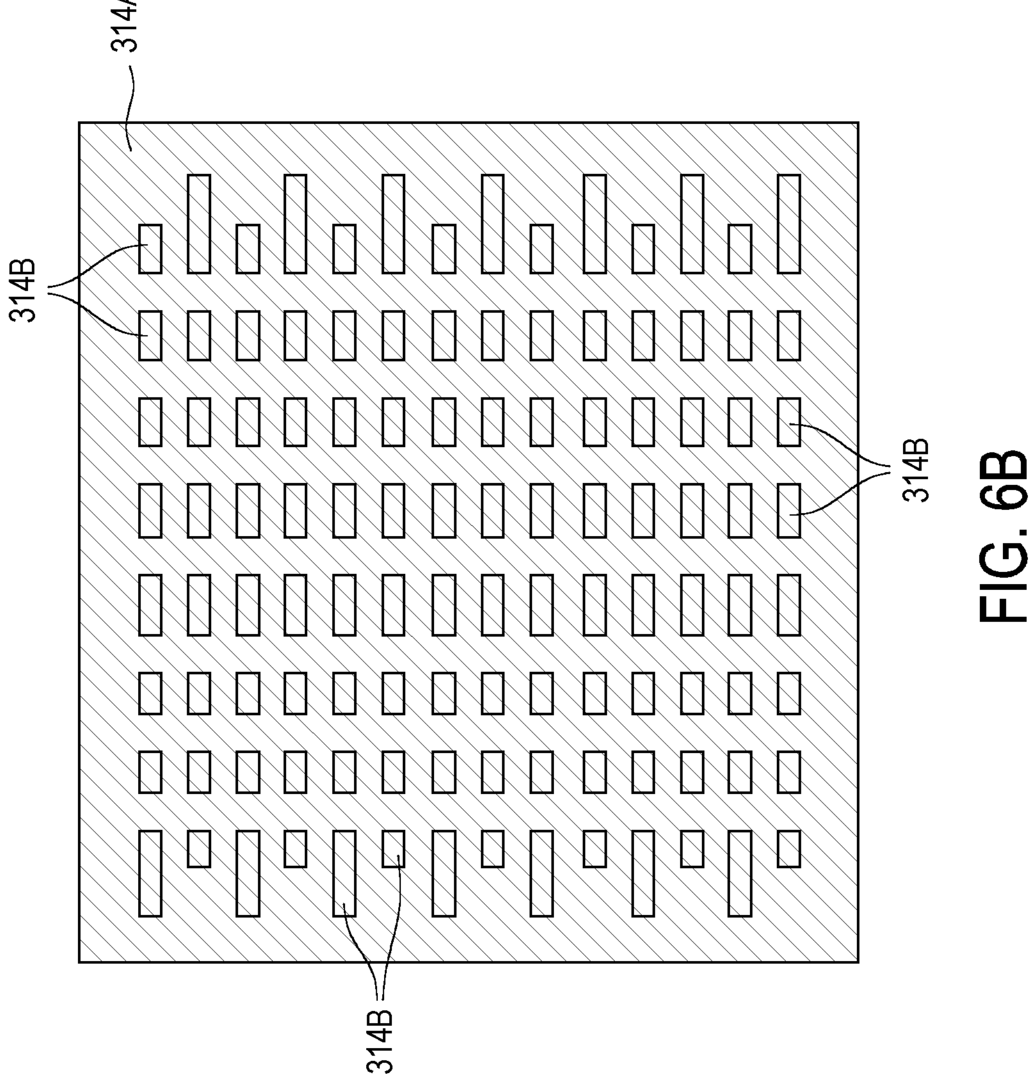
Figure 6C:
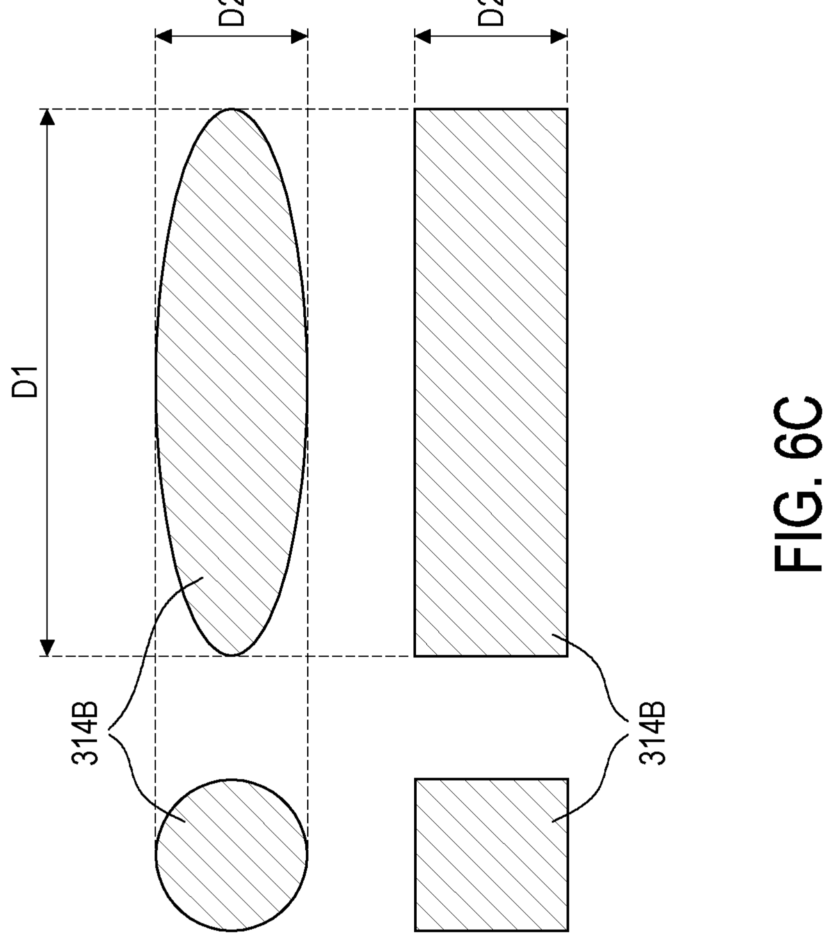

As illustrated in FIG. 6B, the cooling pins 314B formed over the cooling base 314A are arranged in an array on the cooling base 314A. However, the disclosure is not limited thereto. For example, in an alternative embodiment, the cooling pins 314B may be randomly distributed over the cooling base 314A. As further illustrated in FIG. 6B and FIG. 6C, the dimensions of the cooling pins 314B are not particularly limited, and each of the cooling pins 314B disposed on the cooling base 314A may have the same size/shapes or have different size/shapes. For example, from the top view, the cooling pins 314B may have a circular shape, a square shape, an oval shape or a rectangular shape. In some embodiments, when the cooling pins 314B have an oval shape or rectangular shape, the cooling pins 314B may have a length of D1 and a width of D2. In some embodiments, when the cooling pins 314B have a square shape, the cooling pins 314B may have a width of D2. In certain embodiments, when the cooling pins 314B have a circular shape, the cooling pins 314B may have a diameter of D2. In the exemplary embodiment, a ratio (D2:D1) between the width (or diameter) D2 to the length D1 is in a range of 1:2 to 1:1100. In some embodiments, the length D1 is in a range of 0.01 mm to 5.5 mm, and the width (or diameter) D2 is in a range of 0.005 mm to 1 mm. However, the disclosure is not limited thereto, and the dimensions of the cooling pins 314B may be adjusted based on actual product requirements.

Figure 7A:
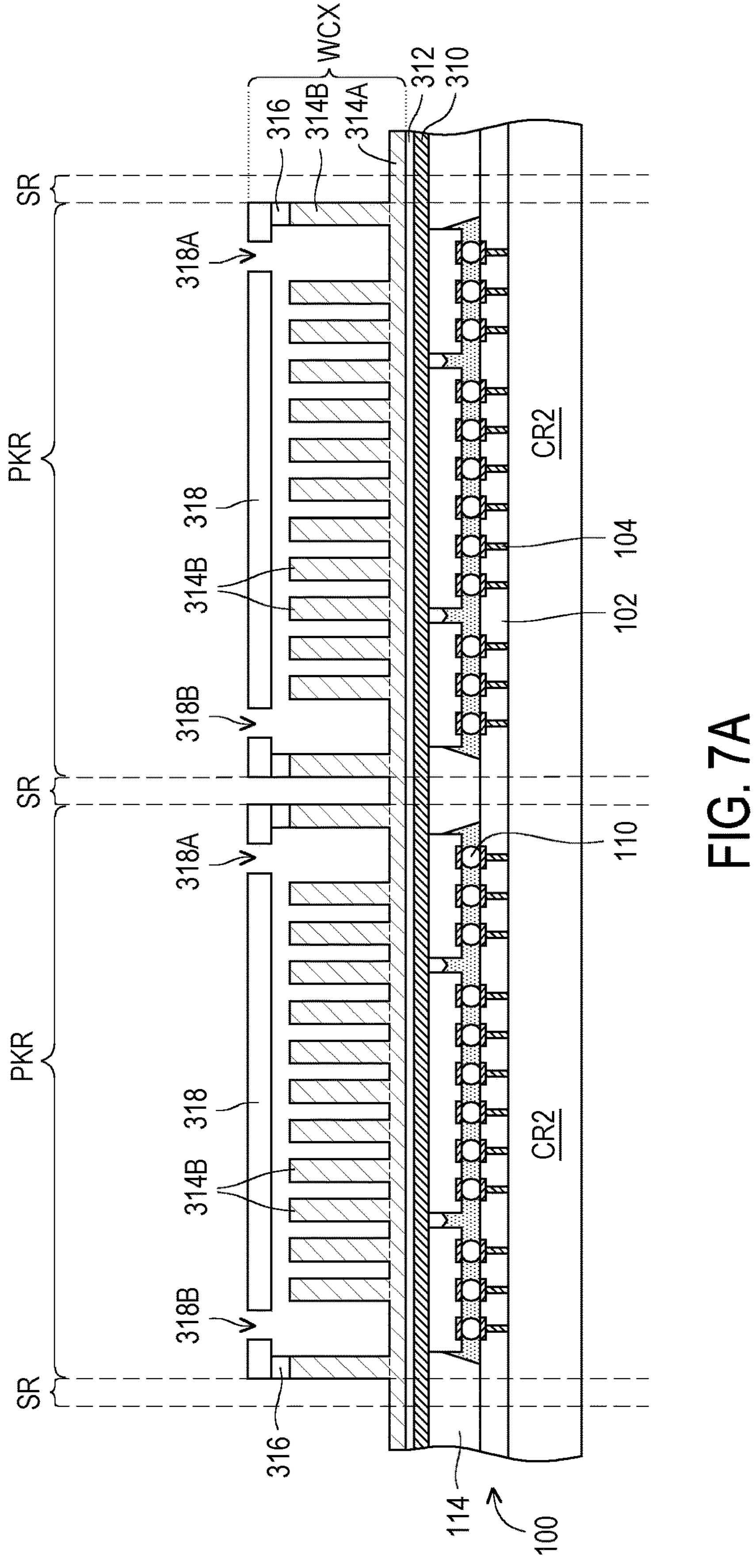
Figure 7B:
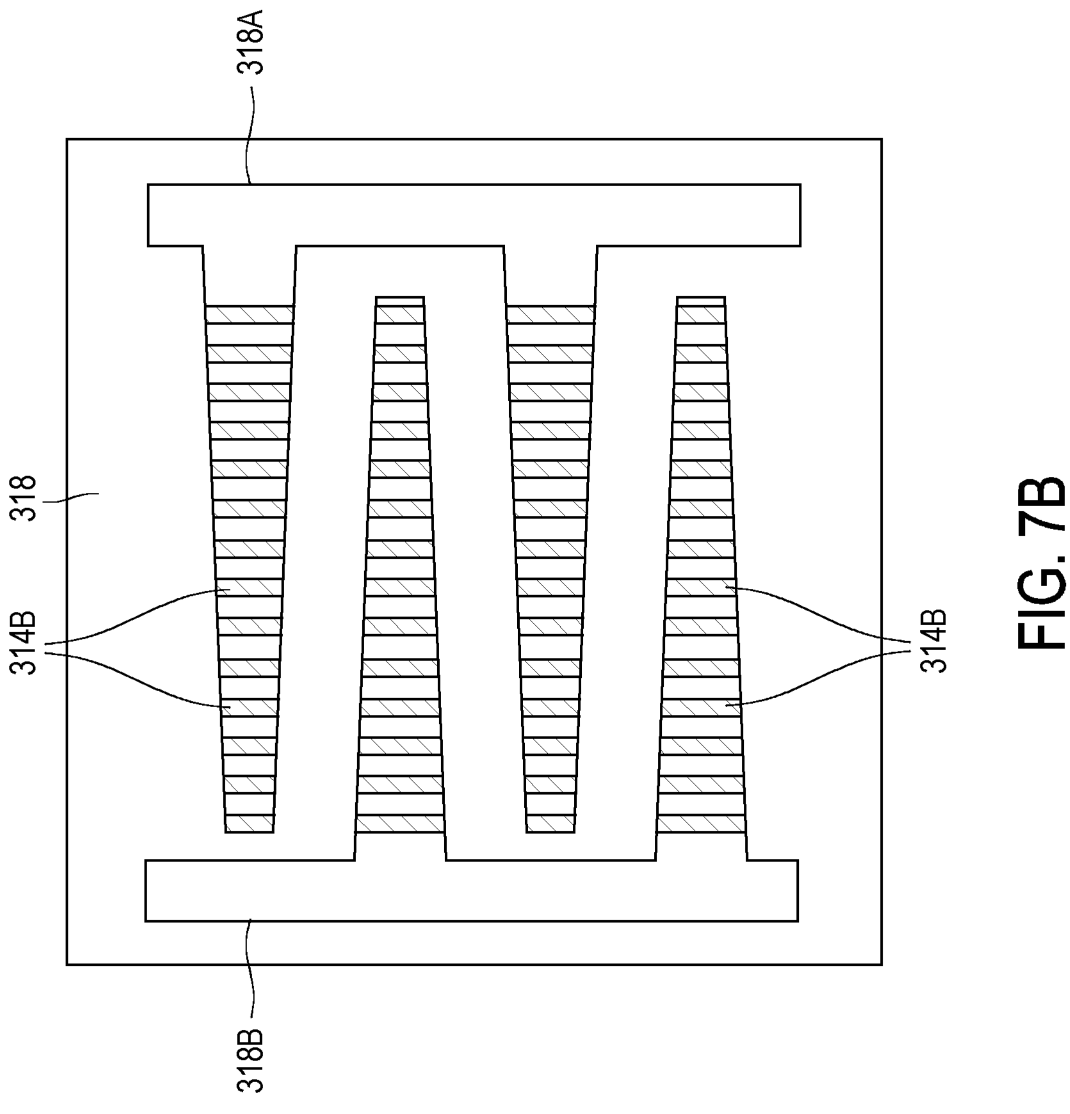

Referring to FIG. 7A, in a subsequent step, a cooler lid 318 is attached to the cooling pins 314B in the package region PKR. For example, the cooler lid 318 is attached/bonded to the cooling pins 314B through an adhesive 316. In some alternative embodiments, the cooler lid 318 may be attached/bonded to the cooling pins 314B through fusion bonding, metal to metal bonding, or the like. In one embodiment, the cooler lid 318 is made of silicon. However, the disclosure is not limited thereto. In alternative embodiments, the cooler lid 318 can be made of conductive materials or other materials depending on the desired type of bonding to the cooling pins 314B. As illustrated in FIG. 7A, and from the top view of the cooler lid 318 shown in FIG. 7B, the cooler lid 318 includes an inlet opening 318A and an outlet opening 318B. For example, the inlet opening 318A and the outlet opening 318B are exposing portions of the cooling pins 314B. In some embodiments, the inlet opening 318A and the outlet opening 318B have a 7 shape or comb shape, but the disclosure is not limited thereto. The shape of the inlet opening 318A and the outlet opening 318B may be adjusted based on product requirement. In the exemplary embodiment, the cooler lid 318 along with the cooling pins 314B and the cooling base 314A together constitute a water-cooling component WCX used for heat dissipation of the semiconductor dies 21, 22.

Figure 8:
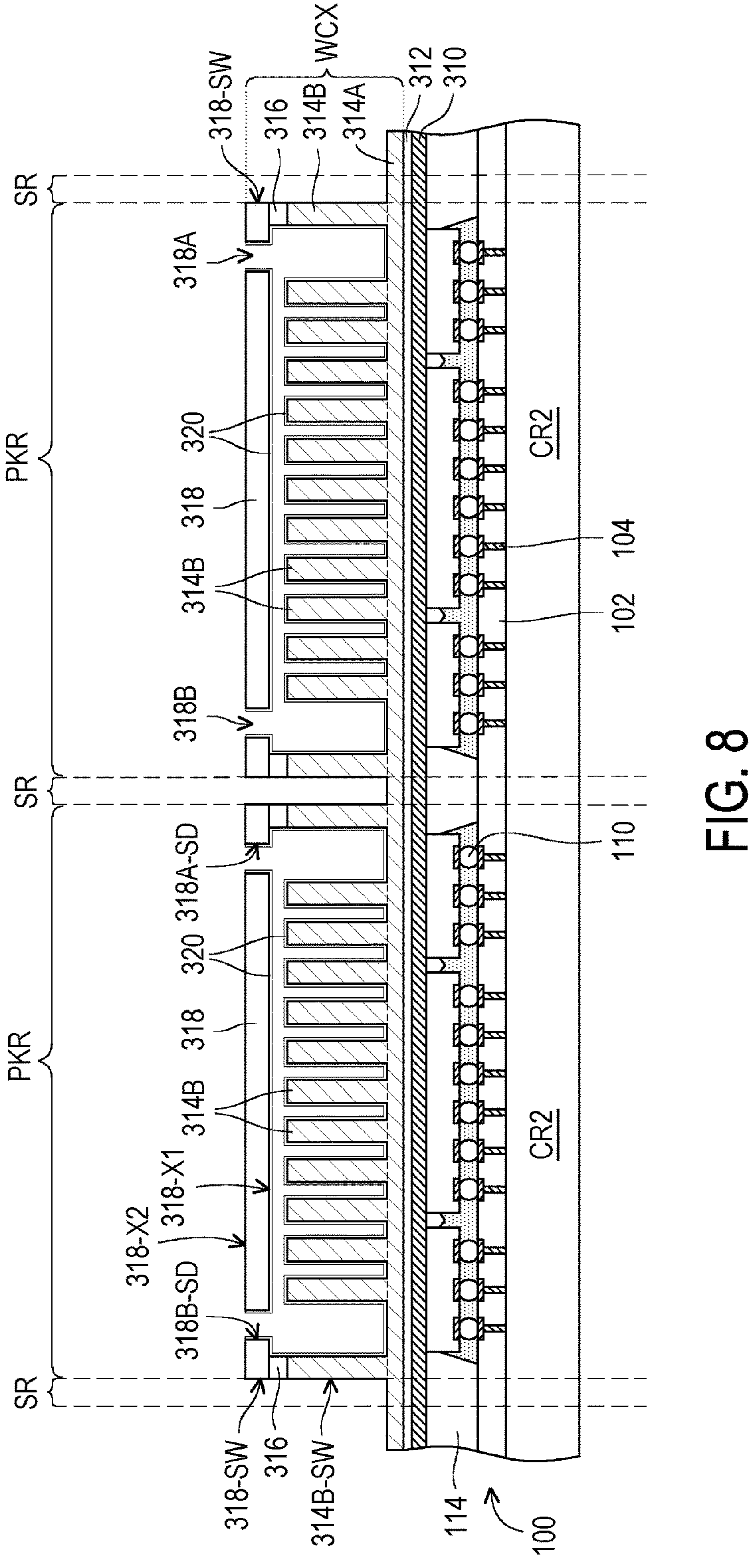

Referring to FIG. 8, an anti-fouling coating 320 (or protective coating 320) is formed on the cooling base 314A, the cooling pins 314B and over the cooler lid 318. The anti-fouling coating 320 is formed by atomic layer deposition (ALD), or the like. In some embodiments, the anti-fouling coating 320 (or protective coating 320) is coated on an inner surface 318-X1 of the cooler lid 318, while an outer surface 318-X2 of the cooler lid 318 is exposed (or free from the anti-fouling coating 320). In certain embodiments, the anti-fouling coating 320 (or protective coating 320) is further coated on side surfaces 318A-SD of the inlet opening 318A and side surfaces 318B-SD of the outlet opening 318B. In some embodiments, the anti-fouling coating 320 (or protective coating 320) is coated on the top surface of the cooling base 314A and coated on the cooling pins 314B. Furthermore, in certain embodiments, the sidewalls 314B-SW of the cooling pins 314B and the sidewalls 318-SW of the cooler lid 318 are free from the anti-fouling coating 320 (or protective coating 320).

In the exemplary embodiment, the anti-fouling coating 320 (or protective coating 320) is made of an antioxidant material. For example, the anti-fouling coating 320 (or protective coating 320) is made of aluminum oxide $Al_2O_3$. However, the disclosure is not limited thereto. In some alternative embodiments, the anti-fouling coating 320 (or protective coating 320) can be made of silicon nitride (SiN) or silicon oxide ($SiO_2$), or other antioxidant materials. The anti-fouling coating 320 (or protective coating 320) is conformally coated on the cooling base 314A, the cooling pins 314B and the cooler lid 318 with a thickness of 10 nm or less. In other words, the anti-fouling coating 320 (or protective coating 320) is made as a relatively thin layer so that it has neglectable impact on thermal conductivity, while the anti-fouling coating 320 can protect the cooling base 314A, the cooling pins 314B and the cooler lid 318 from oxidation or corrosion in water. On the other hand, if the thickness of the anti-fouling coating 320 is made to be larger than 10 nm, then it may result in high thermal resistance at the interface, leading to lowered cooling capacity.

Figure 9:
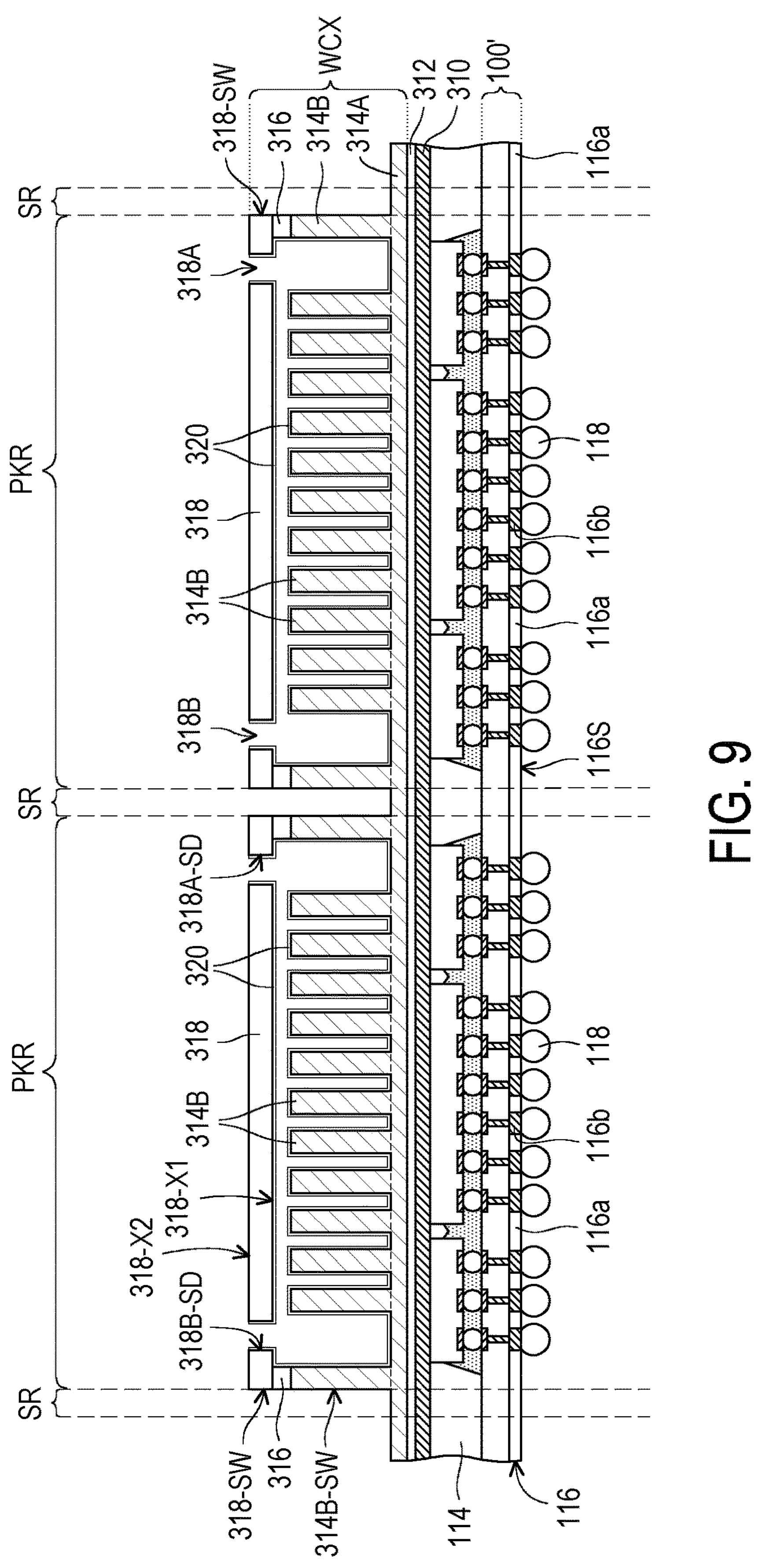

Referring to FIG. 9, in a subsequent step, the carrier CR2 is removed, and a redistribution structure 116 is formed on the second surface 102*b* of the core portion 102 (as shown in FIG. 4) in the package region PKR and over the sub region SR. In some embodiments, the redistribution structure 116, the core portion 102, the through vias 104 and conductive pads 106 constitutes the interposer structure 100'. In some embodiments, the redistribution structure 116 electrically connects the through vias 104 and/or electrically connects the through vias 104 with external devices. In certain embodiments, the redistribution structure 116 includes at least one dielectric layer 116*a* and metallization patterns 116*b* in the dielectric layer 116*a*. In some embodiments, the metallization patterns 116*b* may comprise pads, vias and/or trace lines to interconnect the through vias 104 and to further connect the through vias 104 to one or more external devices. Although one layer of dielectric layer 116*a*, and one layer of the metallization patterns 116*b* is shown in FIG. 9, it should be noted that the number of layers of the dielectric layer 116*a* and the metallization patterns 116*b* is not limited thereto, and could be adjusted based on requirement.

In some embodiments, the material of the dielectric layer 116*a* comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 116*a* may be formed by spin-coating or deposition, including chemical vapor deposition (CVD), PECVD, HDP-CVD, or the like. In some embodiments, the metallization patterns 116*b* include under-metal metallurgies (UBMs). In some embodiments, the formation of the metallization patterns 116*b* may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 116*b* includes copper, aluminum, tungsten, silver, and combinations thereof.

As further illustrated in FIG. 9, a plurality of conductive terminals 118 is disposed on the metallization patterns 116*b*, and are electrically coupled to the through vias 104. In some embodiments, the conductive terminals 118 are placed on the top surface 116*s* of the redistribution structure 116, and electrically connected to the through vias 104 by the metallization patterns 116*b* within the package region PKR. In certain embodiments, the conductive terminals 118 are positioned on and physically attached to the metallization patterns 116*b*. In some embodiments, the conductive terminals 118 include lead-free solder balls, solder balls, ball grid array (BGA) balls, bumps, C4 bumps or micro bumps. In some embodiments, the conductive terminals 118 may include a conductive material such as solder, copper, aluminum, gold, nickel, silver, palladium, tin, or a combination thereof. In some embodiments, the conductive terminals 118 are formed by forming the solder paste on the redistribution structure 116 by, for example, evaporation, electroplating, printing or solder transfer and then reflowed into the desired bump shapes. In some embodiments, the conductive terminals 118 are placed on the redistribution structure 116 by ball placement or the like. In other embodiments, the conductive terminals 118 are formed by forming solder-free metal pillars (such as a copper pillar) by sputtering, printing, electroless or electro plating or CVD, and then forming a lead-free cap layer by plating on the metal pillars. The conductive terminals 118 may be used to bond to an external device or an additional electrical component. In some embodiments, the conductive terminals 118 are used to bond to a circuit substrate, a semiconductor substrate or a packaging substrate.

Figure 10:
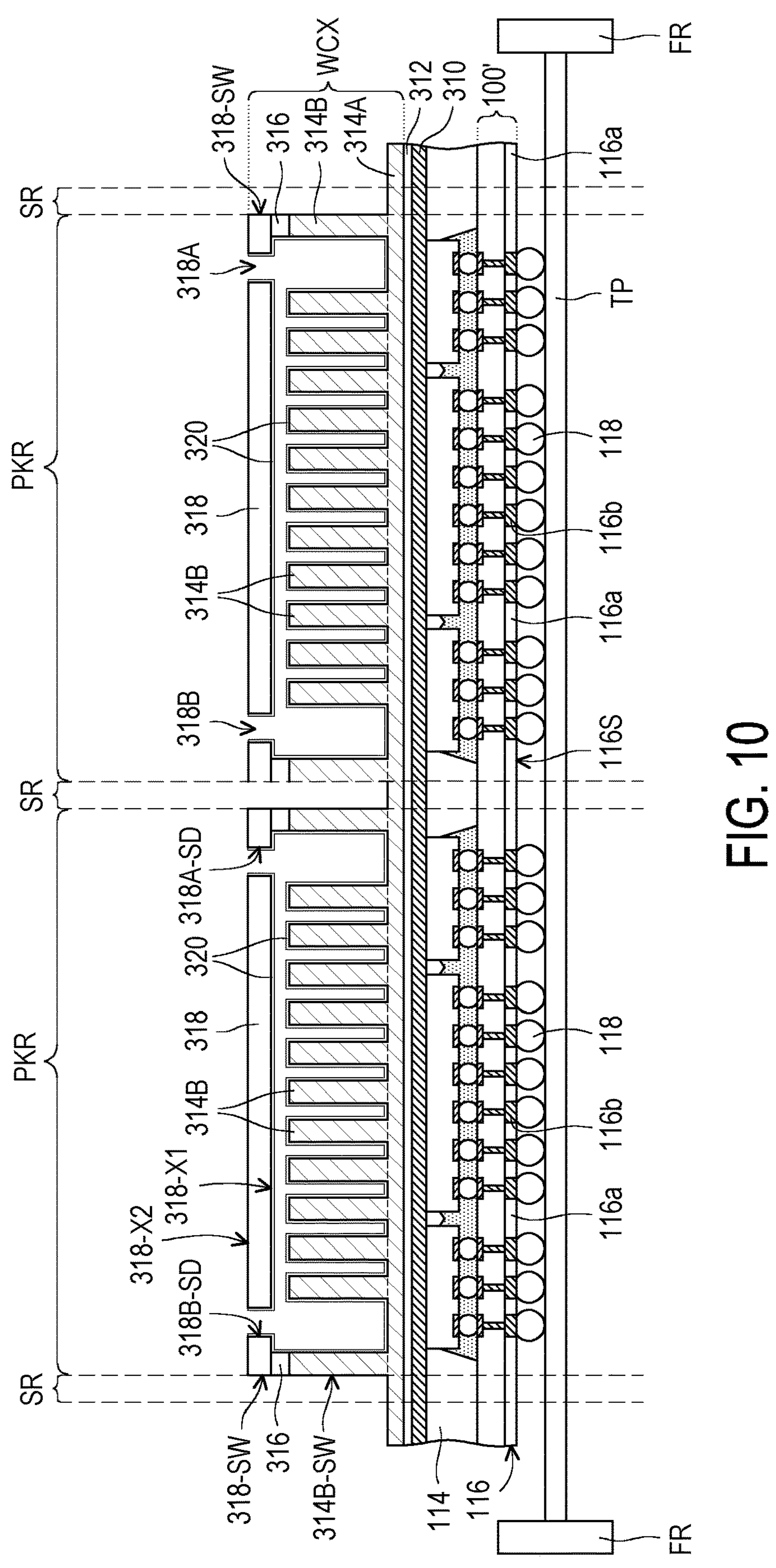

Referring to FIG. 10, in a subsequent step, the structure shown in FIG. 9 is diced or singulated along the sub regions SR to form a plurality of package structures. For example, the dicing process is performed to cut through the redistribution structure 116, the core portion 102, the insulating encapsulant 114, the backside metal layer 310, the seed layer 312 and the cooling base 314A to remove portions of the redistribution structure 116, the core portion 102, the insulating encapsulant 114, the backside metal layer 310, the seed layer 312 and the cooling base 314A along the sub regions SR. In some embodiments, the dicing process or the singulation process typically involves dicing with a rotating blade or a laser beam. In other words, the dicing or singulation process is, for example, a laser cutting process, a mechanical sawing process, or other suitable processes. In some embodiments, the dicing process or the singulation process may be performed on a tape TP (e.g. dicing tape) supported by a frame FR. In other words, the structure shown in FIG. 9 is transferred onto the tape TP so as to perform the dicing process. After the dicing process, the singulated semiconductor device SM1 with a water-cooling component WXC disposed thereon as illustrated in FIG. 11 can be obtained.

Figure 11:
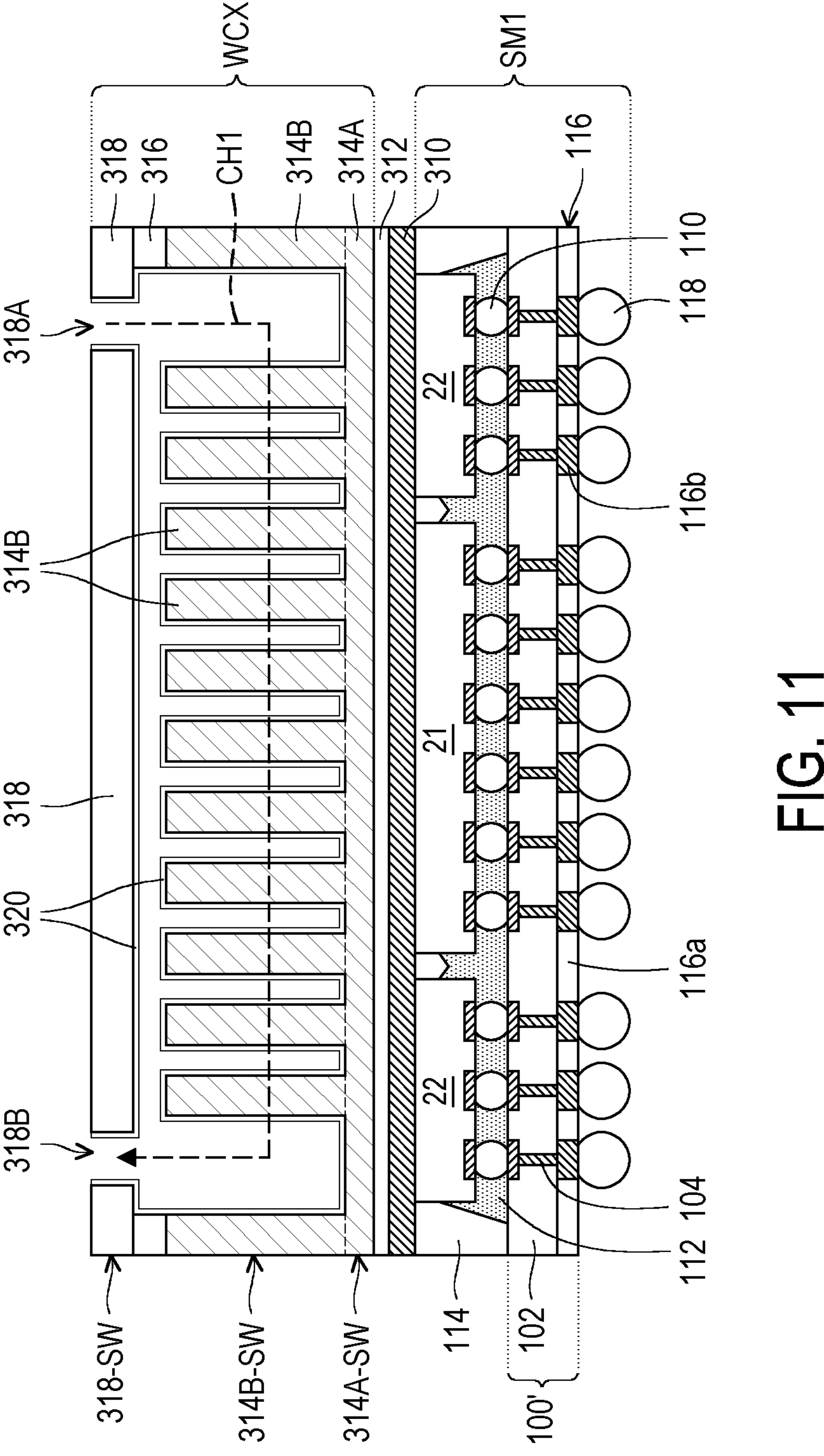

Referring to FIG. 11, in the semiconductor device SM1, the sidewalls of the insulating encapsulant 114 are aligned with the sidewalls 314A-SW of the cooling base 314A, the sidewalls 314B-SW of the cooling pins 314B and the sidewalls 318-SW of the cooler lid 318 in the water-cooling component WXC. In the exemplary embodiment, the cooling base 314A, the cooling pins 314B and the cooler lid 318 are joined together to construct a water flowing channel CH1. In other words, water supplied to the water-cooling component WCX from the inlet opening 318A passes through the water flowing channel CH1 and flows toward the outlet opening 318B to leave the water-cooling component WCX. In certain embodiments, the water flowing channel CH1 passes through the cooling base 314A, the cooling pins 314B and the cooler lid 318.

In the exemplary embodiment, portions of the cooling base 314A, portions of the cooling pins 314B and portions of the cooler lid 318 constituting the water flowing channel 318A is covered by the anti-fouling coating 320 (or protective coating 320). In other words, portions of the water-cooling component WXC where the supplied water flows through will be covered by the anti-fouling coating 320 (or protective coating 320), while the remaining portions of the water-cooling component WXC is free from the anti-fouling coating 320. Since the remaining portions of the water-cooling component WXC are not in direct contact with water, the anti-fouling coating 320 is not required for preventing oxidation or corrosion from water at those regions. In other words, the sidewalls 314A-SW of the cooling base 314A, the sidewalls 314B-SW of the cooling pins 314B and the sidewalls 318-SW of the cooler lid 318 are free from the anti-fouling coating 320 (or protective coating 320).

Figure 12:
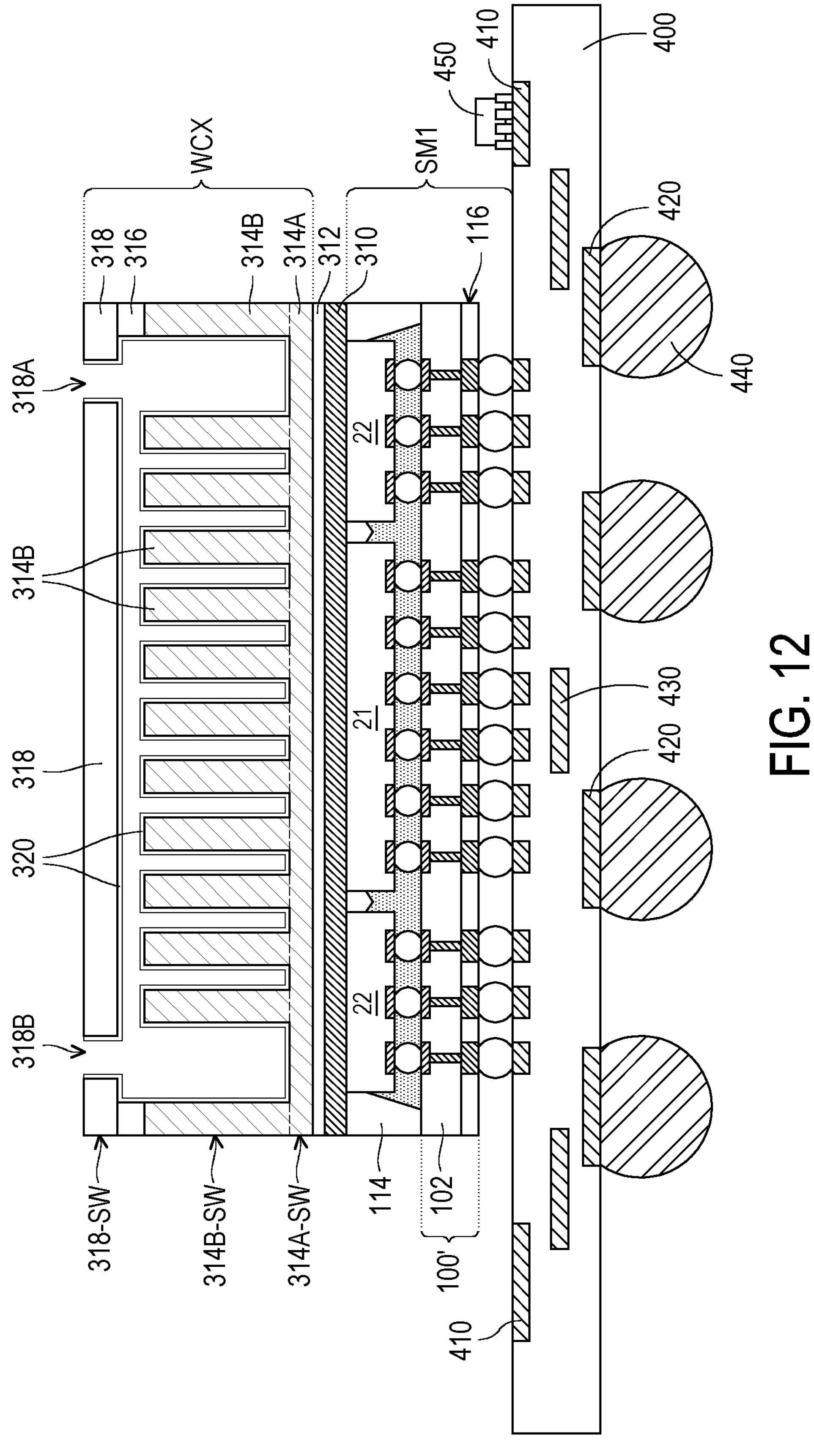
FIG. 12 to FIG. 15 are schematic sectional and top views of various stages in a method of fabricating a package structure according to some exemplary embodiments of the present disclosure.

FIG. 12 to FIG. 15 are schematic sectional and top views of various stages in a method of fabricating a package structure according to some exemplary embodiments of the present disclosure. Referring to FIG. 12, in the exemplary embodiment, the semiconductor device SM1 having the water-cooling component WXC disposed thereon are mounted or attached onto a circuit substrate 400 through the conductive terminals 118. In some embodiments, the circuit substrate 400 includes contact pads 410, contact pads 420, metallization layers 430, and vias (not shown). In some embodiments, the contact pads 410 and the contact pads 420 are respectively distributed on two opposite sides of the circuit substrate 400, and are exposed for electrically connecting with later-formed elements/features. In some embodiments, the metallization layers 430 and the vias are embedded in the circuit substrate 400 and together provide routing function for the circuit substrate 400, wherein the metallization layers 430 and the vias are electrically connected to the contact pads 410 and the contact pads 420. In other words, at least some of the contact pads 410 are electrically connected to some of the contact pads 420 through the metallization layers 430 and the vias. In some embodiments, the contact pads 410 and the contact pads 420 may include metal pads or metal alloy pads. In some embodiments, the materials of the metallization layers 430 and the vias may be substantially the same or similar to the material of the contact pads 410 and the contact pads 420.

Furthermore, in some embodiments, the semiconductor device SM1 is bonded to the circuit substrate 400 through physically connecting the conductive terminals 118 and the contact pads 410 to form a stacked structure. In certain embodiments, the semiconductor device SM1 is electrically connected to the circuit substrate 400. In some embodiments, the circuit substrate 400 is such as an organic flexible substrate or a printed circuit board. In such embodiments, the conductive terminals 118 are, for example, chip connectors. In some embodiments, a plurality of conductive balls 440 are respectively formed on the substrate 400. As illustrated in FIG. 12, for example, the conductive balls 440 are connected to the contact pads 420 of the circuit substrate 400. In other words, the conductive balls 440 are electrically connected to the circuit substrate 400 through the contact pads 420. Through the contact pads 410 and the contact pads 420, some of the conductive balls 440 are electrically connected to the semiconductor device SM1 (e.g. the semiconductor dies 21 and 22 included therein). In some embodiments, the conductive balls 440 are, for example, solder balls or BGA balls. In some embodiments, the semiconductor device SM1 is bonded to the circuit substrate 400 through physically connecting the conductive terminals 118 and the contact pads 410 of the circuit substrate 400 by a chip on wafer on substrate (CoWoS) packaging processes. In addition, as illustrated in FIG. 12, passive devices 450 (integrated passive device or surface mount devices) may be mounted on the circuit substrate 400. For example, the passive devices 450 may be mounted on the contact pads 410 of the circuit substrate 400 through a soldering process. The disclosure is not limited thereto. In certain embodiments, the passive devices 450 may be mounted on the circuit substrate 400 aside the semiconductor device SM1.

Figure 13:
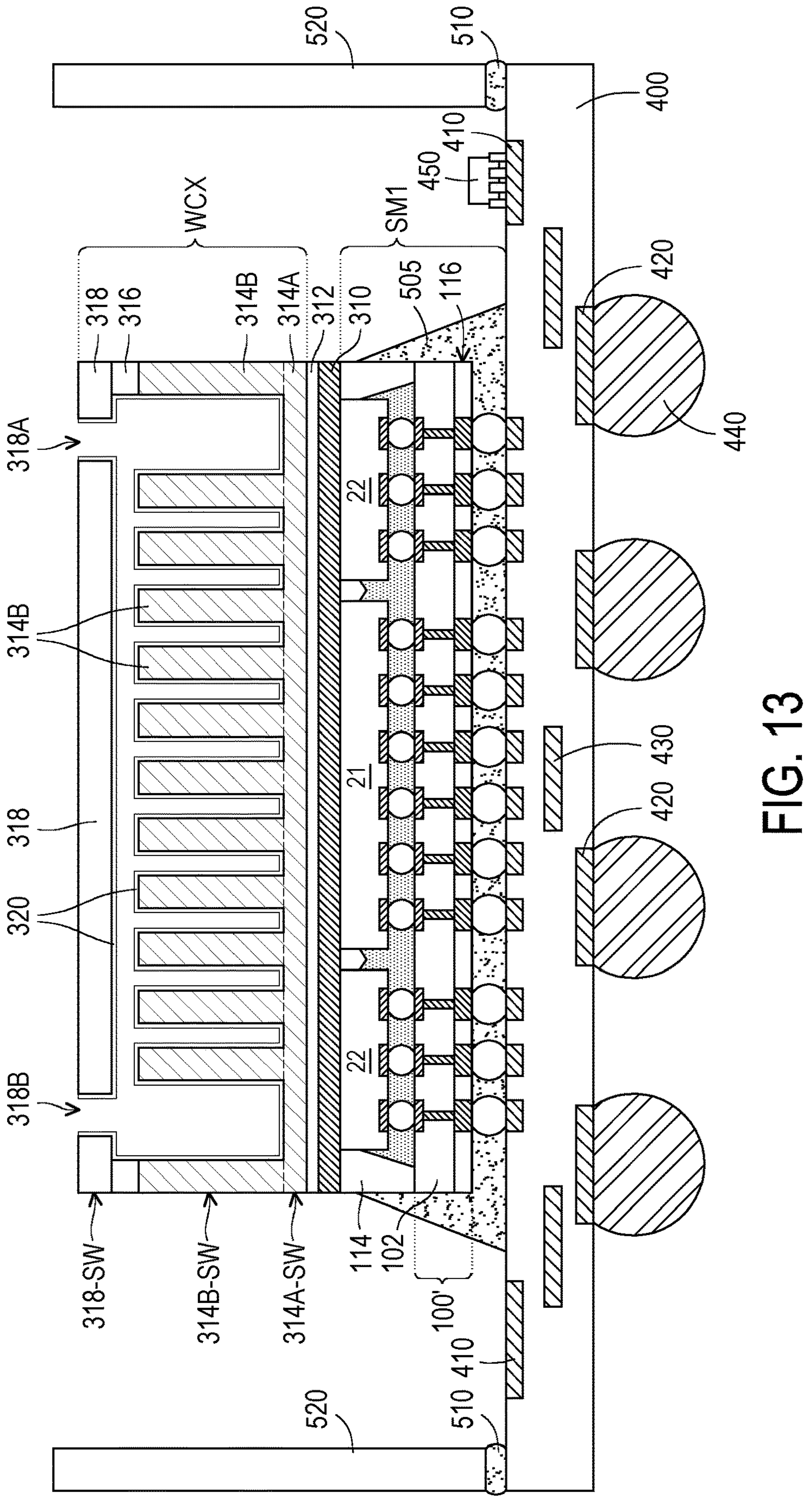

Referring to FIG. 13, in a subsequent step, an underfill structure 505 is formed to fill up the spaces in between the circuit substrate 400 and the semiconductor device SM1. In certain embodiments, the underfill structure 505 fills up the spaces in between adjacent conductive terminals 118 and covers the conductive terminals 118. For example, the underfill structure 505 surrounds the plurality of conductive terminals 118. In some embodiments, the passive devices 450 is exposed by the underfill structure 505, and kept a distance apart from the underfill structure 505. In other words, the underfill structure 505 does not cover the passive devices 450. As further illustrated in FIG. 13, a stiffener ring 520 is further attached on the circuit substrate 400 through an adhesive 510. For example, the stiffener ring 520 surrounds the semiconductor device SM1 and the water-cooling component WXC. In some embodiments, the stiffener ring 520 is attached on the circuit substrate 400 and surrounds the semiconductor device SM1 to constrain the circuit substrate 400 in order to prevent its warpage or other movement relative to the semiconductor device SM1.

Figure 14A:
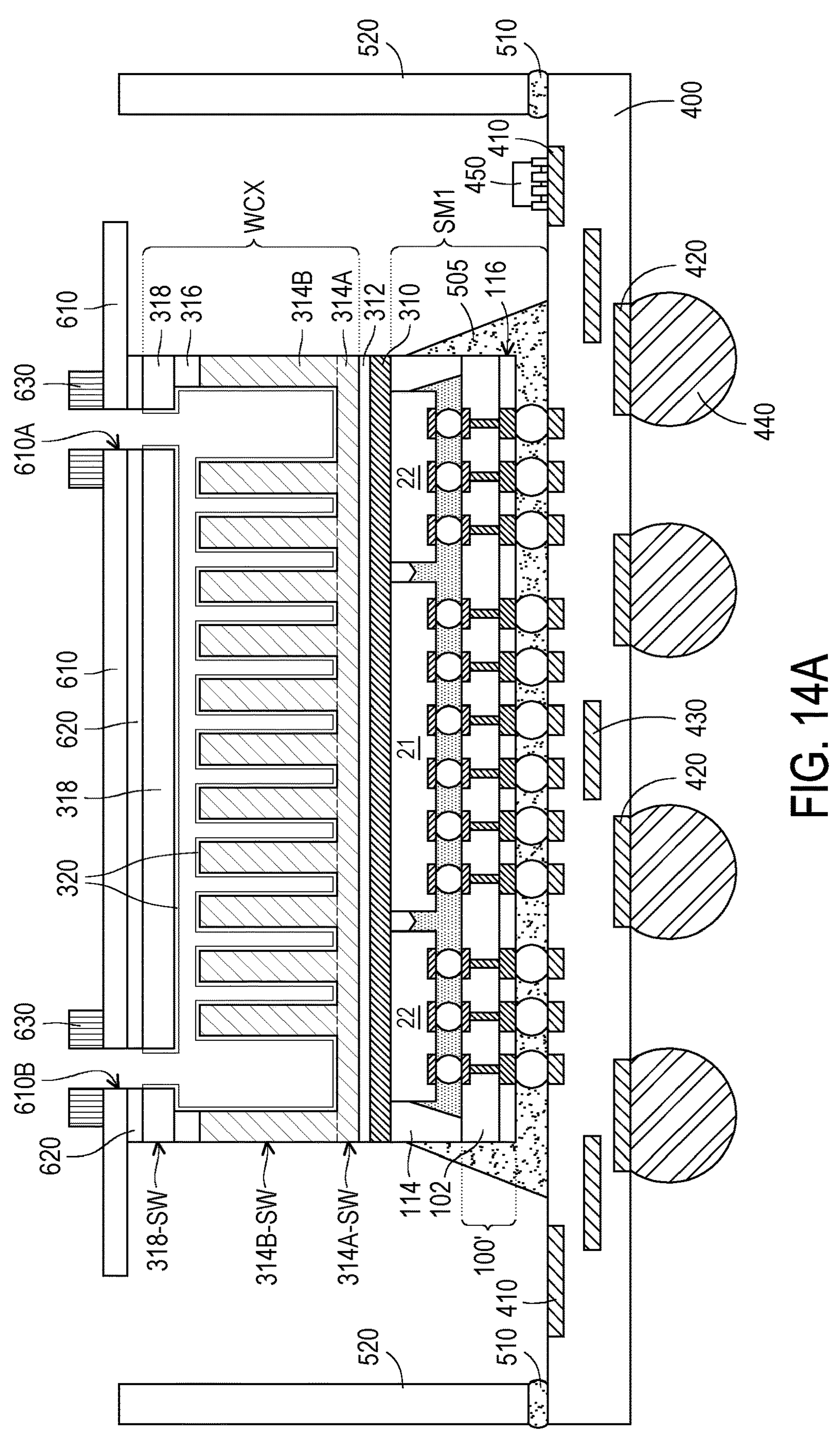
Figure 14B:
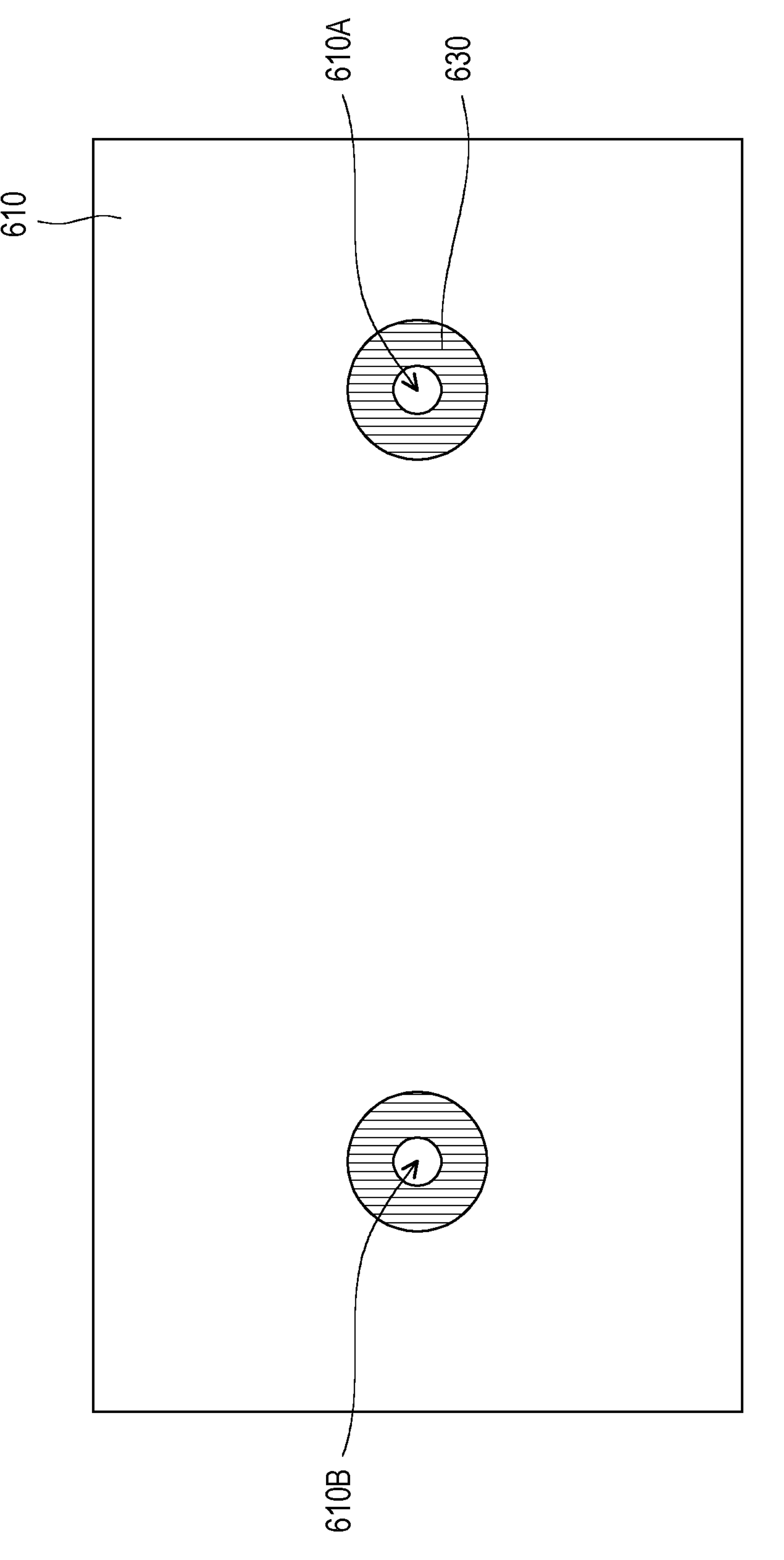

Referring to FIG. 14A, in some embodiments, a top lid 610 is attached on the water-cooling component WXC. For example, the top lid 610 is attached to the outer surface 318-X2 (shown in FIG. 10) of the cooler lid 318 through a sealant 620. In some embodiments, the sealant 620 may be a silicone compound that demonstrates properties such as good adhesion, good electrical insulation, thermal stability, low thermal conductivity, low chemical reactivity, and an ability to repel water. As illustrated in a top view of the top lid 610 as shown in FIG. 14B, the top lid 610 includes a first opening 610A and a second opening 610B. For example, the first opening 610A and the second opening 610B are communicated to an inside of the water-cooling component WCX through the water flowing channel CH1. In the exemplary embodiment, although the first opening 610A and the second opening 610B of the top lid 610 are illustrated as circular openings, it is noted that the disclosure is not limited thereto. In alternative embodiments, the shape of the first opening 610A and the second opening 610B may be adjusted based on design requirement. As further illustrated in FIG. 14A and FIG. 14B, lid connectors 630 may be attached or fixed over the first opening 610A and the second opening 610B. For example, the lid connectors 630 may have openings that corresponds to the shape and size of the first opening 610A and the second opening 610B.

Figure 15:
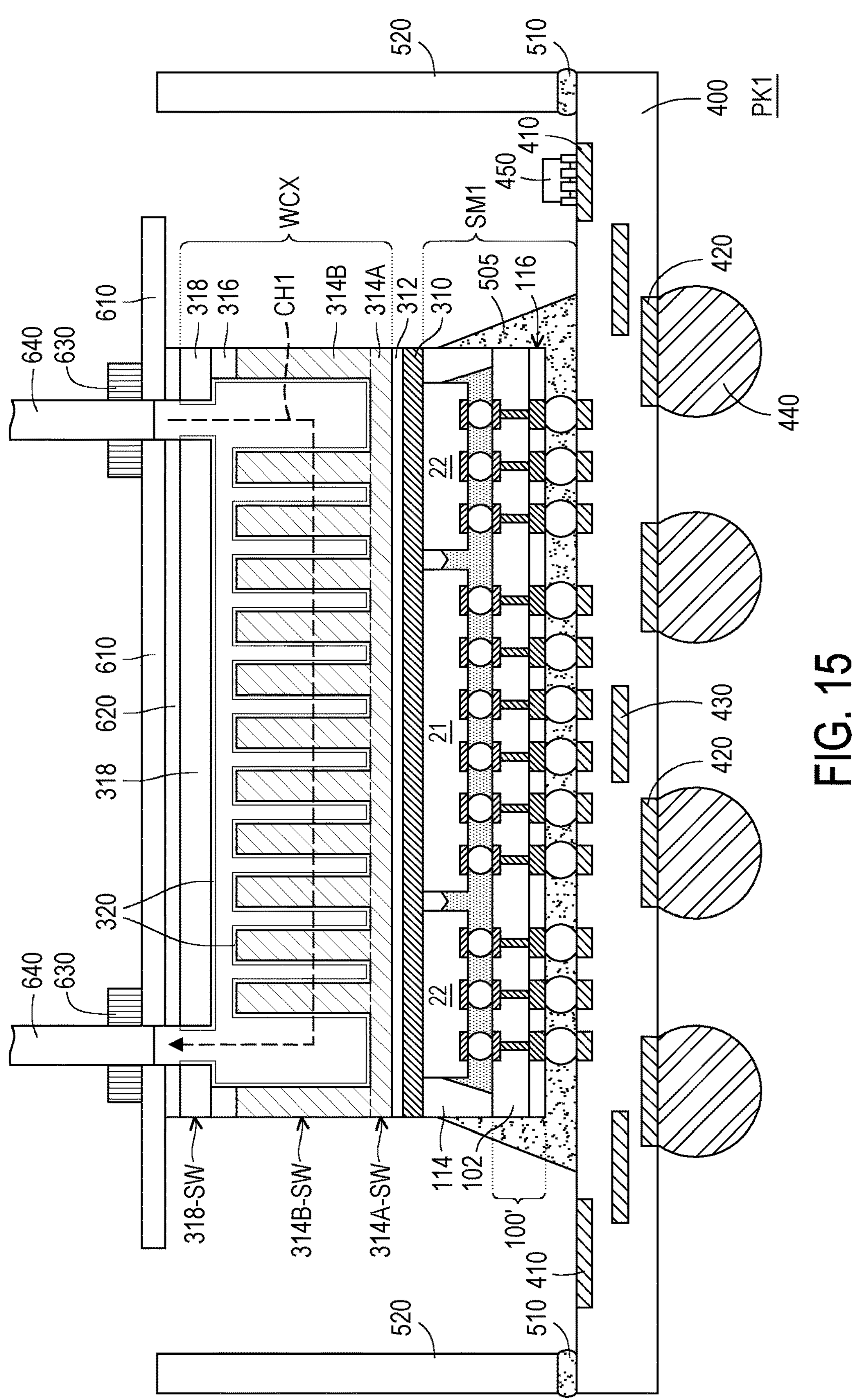

Referring to FIG. 15, in a subsequent step, water cooling tubes 640 (including a water cooling inlet tube and a water cooling outlet tube) are attached or fixed onto the lid connectors 630. After attaching the water cooling tubes 640, a package structure PK1 in accordance with some embodiments of the present disclosure is accomplished. In the package structure PK1, according to some embodiments, water supplied from the water cooling tube 640 (water cooling inlet tube on the right-hand side of FIG. 15) passes through the first opening 610A of the top lid 610 towards the water flowing channel CH1 of the water-cooling component WCX, and flows through the second opening 610B of the top lid 610 towards another water cooling tube 640 (water cooling outlet tube on the left-hand side of FIG. 15). In other words, the supplied water may flow from the water cooling tube 640 (water cooling inlet tub) towards the inlet opening 318A of the cooler lid 318 to the cooling pins 314B, and flows through the outlet opening 318B of the cooler lid 318 through the second opening 610B and back towards another water cooling tube 640 (water cooling outlet tube). In the exemplary embodiment, since the water flowing channel CH1 of the water-cooling component WCX are covered by the anti-fouling coating 320 (or protective coating 320), oxidation and corrosion of the water-cooling component WCX (including cooling base 314A, cooling pins 314B and the cooler lid 318) in water may be prevented. As such, the water-cooling component WCX in the package structure PK1 may have anti-fouling properties while retaining a high thermal conductivity.

Figure 16:
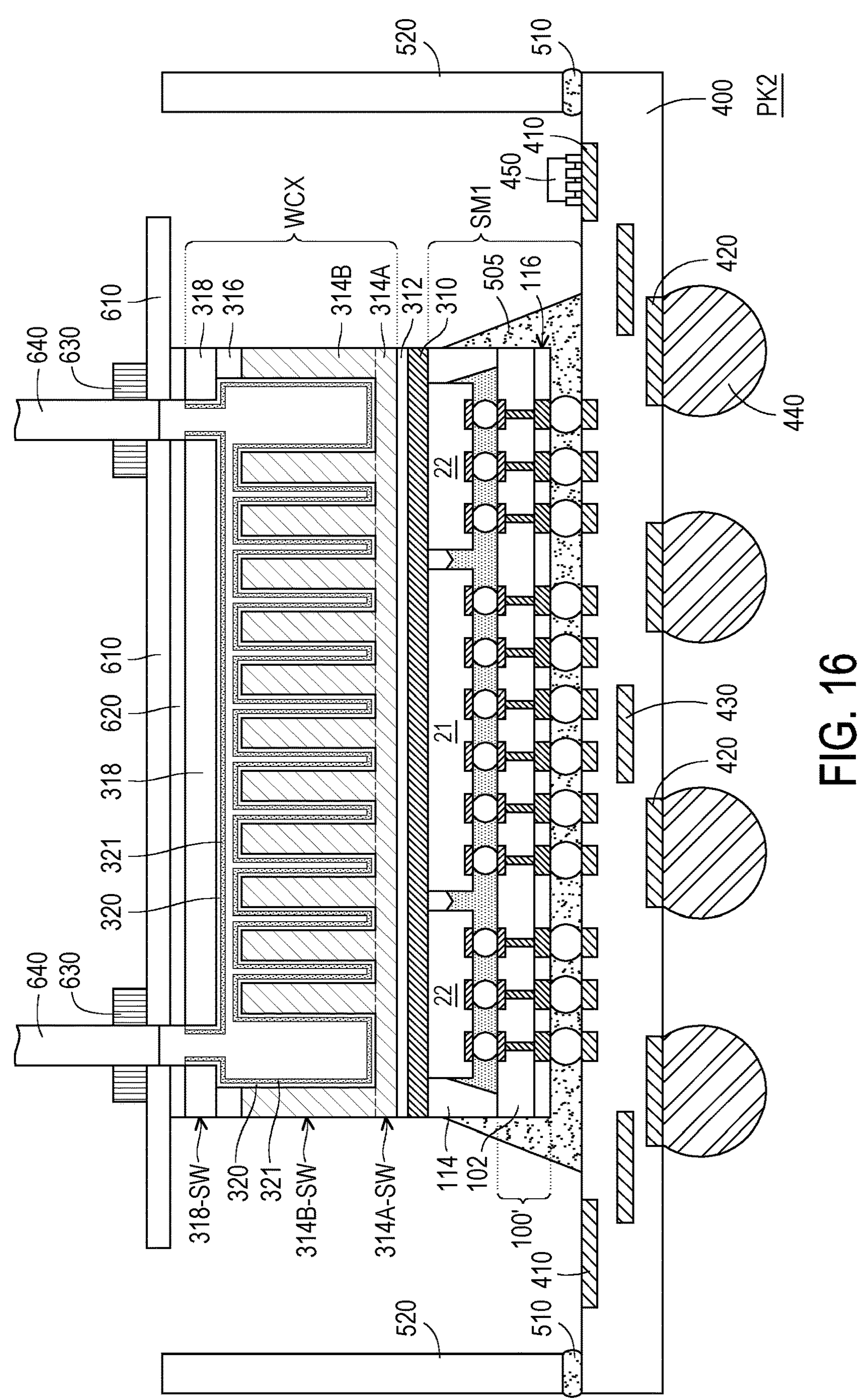
FIG. 16 is a schematic sectional view of a package structure according to some exemplary embodiments of the present disclosure.

FIG. 16 is a schematic sectional view of a package structure according to some exemplary embodiments of the present disclosure. The package structure PK2 illustrated in FIG. 16 is similar to the package structure PK1 illustrated in FIG. 15. Therefore, the same reference numerals are used to refer to the same or liked parts, and its detailed description will not be repeated herein. The difference between the embodiments is that the package structure PK2 of FIG. 16 further includes a second anti-fouling coating 321 (or second protective coating 321) coated over the anti-fouling coating 320 (or protective coating 320). In some embodiments, the second anti-fouling coating 321 (or protective coating 321) is made of an antioxidant material. However, the second anti-fouling coating 321 is different from the anti-fouling coating 320. For example, in one embodiment, when the anti-fouling coating 320 is made of $Al_2O_3$, then the second anti-fouling coating 321 may be made of silicon nitride (SiN) or silicon oxide ($SiO_2$). In certain embodiments, when the anti-fouling coating 320 and the second anti-fouling coating 321 are included, then a sum of the thicknesses of the anti-fouling coating 320 and the second anti-fouling coating 321 is 10 nm or less so that there is neglectable impact on thermal conductivity.

Similar to the above embodiment, since the water flowing channel CH1 of the water-cooling component WCX are covered by the anti-fouling coating 320 (or protective coating 320) and the second anti-fouling coating 321, oxidation and corrosion of the water-cooling component WCX (including cooling base 314A, cooling pins 314B and the cooler lid 318) in water may be prevented. As such, the water-cooling component WCX in the package structure PK2 may have anti-fouling properties while retaining a high thermal conductivity.

In the above-mentioned embodiments, the package structure includes at least a water-cooling component disposed over a semiconductor device, whereby the water-cooling component includes a cooler lid and cooling pins. An anti-fouling coating is coated on at least the cooling pins and on an inner surface of the cooler lid. As such, oxidation and corrosion of the water-cooling component in water may be prevented. As such, the water-cooling component in the package structure may have anti-fouling properties while retaining a high thermal conductivity.

In accordance with some embodiments of the present disclosure, a package structure includes a circuit substrate, a semiconductor device, a plurality of cooling pins, a cooler lid, an anti-fouling coating and a top lid. The semiconductor device is disposed on and electrically connected to the circuit substrate. The cooling pins are disposed on the semiconductor device. The cooler lid is attached to the cooling pins, wherein the cooler lid includes an inlet opening and an outlet opening exposing portions of the cooling pins. The anti-fouling coating is coated on the cooling pins and on an inner surface of the cooler lid. The top lid is attached to an outer surface of the cooler lid.

In accordance with some other embodiments of the present disclosure, a package structure includes a circuit substrate, an interposer structure, a plurality of semiconductor dies and a water-cooling component. The interposer structure is disposed on and electrically connected to the circuit substrate. The semiconductor dies are disposed on and electrically connected to the interposer structure. The water-cooling component is disposed on the plurality of semiconductor dies, wherein the water-cooling component includes a plurality of cooling pins, a cooler lid, a water flowing channel and a protective coating. The cooling pins are disposed over the semiconductor dies. The cooler lid is disposed on the cooling pins. The water flowing channel is passing through the cooling pins and the cooler lid, wherein water supplied to the water-cooling component passes through the water flowing channel. The protective coating is covering the water flowing channel to protect the cooling pins and the cooler lid from the water supplied to the water-cooling component.

In accordance with yet another embodiment of the present disclosure, a method of fabricating a package structure is described. The method includes the following steps. A plurality of cooling pins is formed on a semiconductor device. A cooler lid is attached to the plurality of cooling pins, wherein the cooler lid includes an inlet opening and an outlet opening exposing portions of the cooling pins. An anti-fouling coating is coated on the cooling pins and on an inner surface of the cooler lid. The semiconductor device is bonded to the circuit substrate so that the semiconductor device is electrically connected to the circuit substrate. A top lid is attached to an outer surface of the cooler lid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a circuit substrate;

a semiconductor device disposed on and electrically connected to the circuit substrate;

a backside metal layer disposed on and contacting a backside surface of the semiconductor device;

a cooling base disposed on the semiconductor device and located over the backside metal layer;

a plurality of cooling pins disposed on the semiconductor device and attached to the cooling base;

a cooler lid attached to the plurality of cooling pins, wherein the cooling base, the plurality of cooling pins and the cooler lid are stacked up along a first direction, the cooler lid comprises an inlet opening and an outlet opening exposing portions of the plurality of cooling pins, and sidewalls of the cooling base, sidewalls of the plurality of cooling pins, and sidewalls of the cooler lid are coplanar with sidewalls of the semiconductor device and sidewalls of the backside metal layer along the first direction, and wherein the inlet opening and the outlet opening have a π shape or comb shape;

an anti-fouling coating coated on the plurality of cooling pins and on an inner surface of the cooler lid, wherein the anti-fouling coating is made of aluminum oxide ($Al_2O_3$), and has a thickness of less than 10 nm; and a top lid attached to an outer surface of the cooler lid, wherein the top lid is covering the portions of the plurality of cooling pins, and comprises a first opening and a second opening that are non-overlapped with the plurality of cooling pins.

2. The package structure according to claim 1, wherein the anti-fouling coating is further coated on side surfaces of the inlet opening and side surfaces of the outlet opening.

3. The package structure according to claim 1, wherein the package structure further comprises:

lid connectors attached over the first opening and the second opening; and a water cooling inlet tube and a water cooling outlet tube attached to the lid connectors, wherein water supplied from the water cooling inlet tube passes through the first opening, the inlet opening of the cooler lid to the plurality of cooling pins, and flows through the outlet opening of the cooler lid through the second opening and back to the water cooling outlet tube.

4. The package structure according to claim 1, wherein the semiconductor device comprises:

an interposer structure disposed on and electrically connected to the circuit substrate;

a plurality of semiconductor dies disposed on and electrically connected to the interposer structure; and an insulating encapsulant disposed on the interposer structure and encapsulating the plurality of semiconductor dies, wherein sidewalls of the insulating encapsulant are coplanar with the sidewalls of the plurality of cooling pins and the sidewalls of the cooler lid along the first direction.

5. The package structure according to claim 1, further comprising a stiffener ring attached to the circuit substrate and surrounding the semiconductor device, the plurality of cooling pins and the cooler lid.

6. The package structure according to claim 1, further comprising a seed layer sandwiched between the backside metal layer and the cooling base, and sidewalls of the seed layer are coplanar with the sidewalls of the semiconductor device and the sidewalls of the backside metal layer along the first direction.

7. The package structure according to claim 1, wherein the top lid extends along a second direction over the outer surface of the cooler lid, and extends beyond the sidewalls of the semiconductor device and the sidewalls of the backside metal layer along the second direction, and wherein the second direction is perpendicular to the first direction.

8. The package structure according to claim 1, further comprises forming a second anti-fouling coating coated on the anti-fouling coating and over the plurality of cooling pins and on the inner surface of the cooler lid, wherein the second anti-fouling coating is made of silicon nitride or silicon oxide.

9. A package structure, comprising:

a circuit substrate;

an interposer structure disposed on and electrically connected to the circuit substrate;

a plurality of semiconductor dies disposed on and electrically connected to the interposer structure;

a water-cooling component disposed on the plurality of semiconductor dies, wherein the water-cooling component comprises:

a plurality of cooling pins disposed over the plurality of semiconductor dies;

a cooler lid disposed on the plurality of cooling pins, and having an inlet opening and outlet opening, wherein the inlet opening and the outlet opening have a $\pi$ shape or comb shape;

a water flowing channel passing through the plurality of cooling pins and the inlet opening and the outlet opening of the cooler lid, wherein water supplied to the water-cooling component passes through the water flowing channel; and a protective coating covering the water flowing channel to protect the plurality of cooling pins and the cooler lid from the water supplied to the water-cooling component.

10. The package structure according to claim 9, wherein the water-cooling component further comprises a cooling base attached to the plurality of cooling pins, and wherein the cooling base, the plurality of cooling pins and the cooler lid are joined together to construct the water flowing channel, and portions of the cooling base constituting the water flowing channel is covered by the protective coating.

11. The package structure according to claim 10, wherein sidewalls of the cooling base, sidewalls of the plurality of cooling pins and sidewalls of the cooler lid are aligned with one another, and the sidewalls of the cooling base, the sidewalls of the plurality of cooling pins and the sidewalls of the cooler lid are free from the protective coating.

12. The package structure according to claim 10, further comprising:

a backside metal layer disposed in between the cooling base and the plurality of semiconductor dies; and a seed layer sandwiched between the backside metal layer and the cooling base.

13. The package structure according to claim 9, wherein the protective coating is an antioxidant material.

14. The package structure according to claim 9, further comprising a top lid attached to the cooler lid, wherein the top lid comprises a first opening and a second opening, and the first opening and the second opening are communicated to an inside of the water-cooling component through the water flowing channel.

15. The package structure according to claim 14, further comprising:

lid connectors attached over the first opening and the second opening of the top lid; and a water cooling inlet tube and a water cooling outlet tube attached to the lid connectors, wherein the water supplied to the water-cooling component is supplied from the water cooling inlet tube to the water flowing channel, and flows through the second opening and back to the water cooling outlet tube.

16. The package structure according to claim 14, wherein the cooler lid is attached to the plurality of cooling pins through an adhesive, and the top lid is attached to the cooler lid through a sealant.

17. A method of fabricating a package structure, comprising:

forming a backside metal layer disposed on and contacting a semiconductor device;

forming a cooling base and a plurality of cooling pins on the semiconductor device, wherein the cooling base is located over the backside metal layer, and the plurality of cooling pins is disposed on the semiconductor device and attached to the cooling base;

attaching a cooler lid to the plurality of cooling pins, wherein the cooling base, the plurality of cooling pins and the cooler lid are stacked up along a first direction, the cooler lid comprises an inlet opening and an outlet opening exposing portions of the plurality of cooling pins, and sidewalls of the cooling base, sidewalls of the plurality of cooling pins, and sidewalls of the cooler lid are coplanar with sidewalls of the semiconductor device and sidewalls of the backside metal layer along the first direction, and wherein the inlet opening and the outlet opening have a $\pi$ shape or comb shape;

forming an anti-fouling coating coated on the plurality of cooling pins and on an inner surface of the cooler lid, wherein the anti-fouling coating is made of aluminum oxide ($Al_2O_3$), and has a thickness of less than 10 nm;

bonding the semiconductor device to a circuit substrate so that the semiconductor device is electrically connected to the circuit substrate; and attaching a top lid to an outer surface of the cooler lid, wherein the top lid is covering the portions of the plurality of cooling pins, and comprises a first opening and a second opening that are non-overlapped with the plurality of cooling pins.

18. The method according to claim 17, wherein the anti-fouling coating is further coated on side surfaces of the inlet opening and side surfaces of the outlet opening.

19. The method according to claim 17, wherein the anti-fouling coating is formed through atomic layer deposition.

20. The method according to claim 17, comprising:

attaching lid connectors over the first opening and the second opening; and attaching a water cooling inlet tube and a water cooling outlet tube to the lid connectors, wherein water supplied from the water cooling inlet tube passes through the first opening, the inlet opening of the cooler lid to the plurality of cooling pins, and flows through the outlet opening of the cooler lid through the second opening and back to the water cooling outlet tube.

* * * * *